US010303127B2

(12) United States Patent
Mazur et al.

(10) Patent No.: US 10,303,127 B2
(45) Date of Patent: *May 28, 2019

(54) APPARATUS TO INTERFACE PROCESS AUTOMATION AND ELECTRICAL AUTOMATION SYSTEMS

(71) Applicant: Rockwell Automation Technologies, Inc., Mayfield Heights, OH (US)

(72) Inventors: David C. Mazur, Mequon, WI (US); Scott D. Day, Richfield, WI (US); Bruce K. Venne, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 158 days.

This patent is subject to a terminal disclaimer.

(21) Appl. No.: 15/382,689

(22) Filed: Dec. 18, 2016

(65) Prior Publication Data
US 2017/0097615 A1    Apr. 6, 2017

Related U.S. Application Data

(63) Continuation-in-part of application No. 15/244,035, filed on Aug. 23, 2016.
(Continued)

(51) Int. Cl.
*G05F 1/66* (2006.01)
*G05B 11/01* (2006.01)
(Continued)

(52) U.S. Cl.
CPC .......... *G05B 11/01* (2013.01); *G01R 19/2513* (2013.01); *G05B 19/042* (2013.01);
(Continued)

(58) Field of Classification Search
CPC ....... H04L 45/54; H04L 45/64; H04L 43/026; H04L 45/28; H04L 49/70
See application file for complete search history.

(56) References Cited

U.S. PATENT DOCUMENTS 6,005,759 A     12/1999  Hart et al.
6,662,124 B2    12/2003  Schweitzer, III et al.
(Continued)

FOREIGN PATENT DOCUMENTS

EP         0242609 A1     10/1987
WO    WO 2014175884 A1   10/2014

OTHER PUBLICATIONS

Feby Mohammed: "AUP23—Prosoft Technology", Jan. 1, 2013, pp. 1-48.
(Continued)

*Primary Examiner* — Dady Chery
(74) *Attorney, Agent, or Firm* — Fay Sharpe LLP

(57) ABSTRACT

Systems, methods and apparatus are disclosed for interfacing process controllers in a process automation system with one or more intelligent electrical devices of an electrical automation system to use process and electrical control space information to perform actions and make decisions regarding actions in a connected enterprise system to facilitate energy management goals as well as process control goals in view of electrical control space information and process control space information. Some embodiments include an enclosure for a Motor Control Center unit, comprising: a DC power supply; an Ethernet switch; a network gateway module; and a controller.

21 Claims, 17 Drawing Sheets

Related U.S. Application Data

(60) Provisional application No. 62/218,801, filed on Sep. 15, 2015, provisional application No. 62/270,904, filed on Dec. 22, 2015, provisional application No. 62/270,939, filed on Dec. 22, 2015, provisional application No. 62/270,892, filed on Dec. 22, 2015, provisional application No. 62/270,918, filed on Dec. 22, 2015.

(51) Int. Cl.
*G05B 19/042* (2006.01)
*G01R 19/25* (2006.01)
*H02J 3/14* (2006.01)
*H02J 13/00* (2006.01)
*H04J 3/06* (2006.01)

(52) U.S. Cl.
CPC ........... *G05B 19/0423* (2013.01); *G05F 1/66* (2013.01); *H02J 3/14* (2013.01); *H02J 13/00* (2013.01); *H02J 13/0013* (2013.01); *H04J 3/0658* (2013.01); *G05B 2219/34012* (2013.01); *H04J 3/0667* (2013.01); *Y02B 70/3225* (2013.01); *Y02B 70/3241* (2013.01); *Y02B 90/2607* (2013.01); *Y02E 60/724* (2013.01); *Y02P 80/114* (2015.11); *Y02P 90/86* (2015.11); *Y04S 10/18* (2013.01); *Y04S 20/222* (2013.01); *Y04S 20/227* (2013.01); *Y04S 40/12* (2013.01)

(56) References Cited

U.S. PATENT DOCUMENTS

| | | | |
|---|---|---|---|
| 6,751,562 B1 | 6/2004 | Blackett et al. | |
| 6,830,477 B2* | 12/2004 | Vander Vorste | H01R 13/743 439/214 |
| 7,028,204 B2 | 4/2006 | Jammes et al. | |
| 7,734,359 B2 | 6/2010 | Deveaux et al. | |
| 8,082,367 B2 | 12/2011 | Etheridge et al. | |
| 8,812,256 B2 | 8/2014 | Lee et al. | |
| 8,894,533 B2 | 11/2014 | Kuo | |
| 9,077,208 B2 | 7/2015 | Bickel | |
| 9,128,130 B2 | 9/2015 | Seeley | |
| 9,270,552 B2 | 2/2016 | Jubinville et al. | |
| 9,331,805 B2 | 5/2016 | Steiner et al. | |
| 9,363,200 B2 | 6/2016 | Kasztenny et al. | |
| 9,383,735 B2 | 7/2016 | Schweitzer, III et al. | |
| 9,520,860 B2 | 12/2016 | Whitehead et al. | |
| 9,537,768 B2 | 1/2017 | Baier et al. | |
| 9,577,817 B2 | 2/2017 | Yun et al. | |
| 9,590,411 B2 | 3/2017 | Achanta | |
| 9,819,227 B2 | 11/2017 | Zweigle et al. | |
| 9,860,003 B2 | 1/2018 | Shenoi et al. | |
| 10,158,442 B1 | 12/2018 | Volpe | |
| 10,164,759 B1 | 12/2018 | Volpe | |
| 2002/0010801 A1* | 1/2002 | Meagher | H04L 41/0226 709/251 |
| 2002/0141356 A1 | 10/2002 | Beidas et al. | |
| 2007/0019605 A1 | 1/2007 | Rioux et al. | |
| 2011/0002429 A1 | 1/2011 | Williams et al. | |
| 2011/0035065 A1 | 2/2011 | Schweitzer, III et al. | |
| 2011/0135047 A1 | 6/2011 | Tournier et al. | |
| 2011/0161468 A1 | 6/2011 | Tuckey et al. | |
| 2011/0163913 A1 | 7/2011 | Cohen et al. | |
| 2011/0307144 A1 | 12/2011 | Kunsman et al. | |
| 2012/0010831 A1 | 1/2012 | Kagan | |
| 2014/0001977 A1 | 1/2014 | Zacharchuk et al. | |
| 2014/0025321 A1* | 1/2014 | Spanier | G01R 21/133 702/62 |
| 2014/0355597 A1 | 12/2014 | Yeh et al. | |
| 2015/0078200 A1 | 3/2015 | Kalkunte et al. | |
| 2016/0098025 A1 | 4/2016 | Mansouri et al. | |
| 2016/0197719 A1 | 7/2016 | Wang | |
| 2017/0012522 A1 | 1/2017 | de Cremoux | |
| 2018/0013507 A1 | 1/2018 | Varghese et al. | |

OTHER PUBLICATIONS

Nn: "ESD AOP Guidelines for Logix Designer Application Techniques", Apr. 1, 2012, pp. 1-72.

European Search Report of European Application No. 16188747.6-1875 dated Feb. 6, 2017, 8 pgs.

Paolo Ferrari et al.: "Evaluation of Time Gatways for Syunchronization of Substation Automation Systems", IEEE Transactions on Instrumentation and Measurment, IEEE Service Center, Piscataway, NJ, US, vol. 61, No. 10, Oct. 1, 2012, 10 pages.

Robert M. Spiewak et al.: "Improving substation reliability and availability", Petroleum and Chemical Industry Conference, 2009. PCIC 2009. 2009 Record of Conference Papers—Industry Applications Society 56th Annual, IEEE, Piscatawy, NJ, US, Sep. 14, 2009, 17 pages.

Serizawa Y et al.: "Use Case Study on a Decentralized Modular Device Network for Wide-Area Monitoring, Protection and Control", 2012 IEEE Power and Energy Society General Meeting; San Diego, California, US; Jul. 22-26, 2012 IEEE, Piscatawy, NJ, US, Jul. 22, 2012, 8 pages.

Jeffrey Vasel: "One Plant, One System: Benefits of Integrating Process and Power Automation", Protective Relay Engineers, 2012 65th Annual Conference for; IEEE, Apr. 2, 2012, 35 pages.

Paper titled "RSLogix PLC Programming—Production Control—Rockwell Sorftware", http://www.rockwellautomation.com/rockwellsoftware/products/rslogix.page, 2 page downloaded Jul. 5, 2016.

Paper titled "IntelliCENTER® Technology with EtherNet/IP Networked Centerline® Motor Control Centers Deliver Real Time Information", Published Oct. 2015, http://ab.rockwellautomation.com/motor-control/motor-control-centers/intellicenter-software#documentation, 12 pgs. downloaded Dec. 18, 2016.

* cited by examiner

APPARATUS TO INTERFACE PROCESS AUTOMATION AND ELECTRICAL AUTOMATION SYSTEMS

CROSS-REFERENCE TO RELATED APPLICATIONS

This application is a continuation-in-part of, and claims priority to and the benefit of, U.S. patent application Ser. No. 15/244,035, filed on Aug. 23, 2016, entitled INDUSTRIAL AUTOMATION PACKAGED POWER SOLUTION FOR INTELLIGENT MOTOR CONTROL AND INTELLIGENT SWITCHGEAR WITH ENERGY MANAGEMENT, which claims priority to, and the benefit of, U.S. Provisional Application No. 62/218,801, filed Sep. 15, 2015, entitled INDUSTRIAL AUTOMATION PACKAGED POWER SOLUTION FOR INTELLIGENT MOTOR CONTROL AND INTELLIGENT SWITCHGEAR WITH ENERGY MANAGEMENT, the entireties of which are hereby incorporated by reference.

This application claims, under 35 USC § 119, priority to, and the benefit of U.S. Provisional Application Ser. No. 62/270,904, filed Dec. 22, 2015, and entitled PACKAGED POWER MCC INTERFACE BUCKET (NEMA), the entirety of which application is hereby incorporated by reference.

This application claims, under 35 USC § 119, priority to, and the benefit of U.S. Provisional Application Ser. No. 62/270,939, filed Dec. 22, 2015 and entitled PACKAGED POWER MCC INTERFACE BUCKET (IEC), the entirety of which application is hereby incorporated by reference.

This application claims, under 35 USC § 119, priority to, and the benefit of U.S. Provisional Application Ser. No. 62/270,892, filed Dec. 22, 2015, and entitled INTELLIGENT, INTEGRATED POWER CONTROL LINEUP, the entirety of which application is hereby incorporated by reference.

This application claims, under 35 USC § 119, priority to, and the benefit of U.S. Provisional Application Ser. No. 62/270,918, filed Dec. 22, 2015 and entitled INTELLIGENT, INTEGRATED POWER CONTROL LINEUP, the entirety of which application is hereby incorporated by reference.

BACKGROUND INFORMATION

Manufacturing facilities and other enterprises often include machines, motors, and other controlled devices and processes operated by process control equipment forming a process automation system. These controlled processes and devices, in turn, are powered by power distribution systems. Electrical automation systems have been developed that can be used to conserve energy, perform load shedding, load sharing, and other actions on multiple electrical devices within a power distribution system. However, process control goals and electrical automation or energy management goals are often in conflict, and conventional systems do not provide for process control and electrical automation system actions in concert with one another to achieve optimal energy management as well as process automation goals.

BRIEF DESCRIPTION

Connected enterprise systems, techniques and apparatus are described to facilitate integration of control space or process automation systems with an electrical automation system space of an enterprise to facilitate intelligent electrical space operation and intelligent power management according to process control space operations and considerations.

Disclosed examples include an apparatus to interface a process automation system including one or more process automation system devices connected to a first network with an electrical automation system including an intelligent electrical device (IED) connected to a second network. The apparatus comprises an enclosure with an interior, a network switch disposed in the interior of the enclosure and operatively coupled with the first network, a process controller disposed in the interior of the enclosure and operatively coupled with the network switch, and a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch. The process controller is configured to execute an add-on instruction (AOI) to selectively convert unsigned IED data into signed IED data, and scale raw IED data from the IED according to user-defined scale factors to provide scaled data values for use by the process controller in controlling at least one process.

Another disclosed example includes an apparatus to interface a process automation system including one or more process automation system devices connected to a first network with an electrical automation system including an intelligent electrical device (IED) connected to a second network. The apparatus comprises an enclosure with an interior, a network switch disposed in the interior of the enclosure and operatively coupled with the first network, a process controller disposed in the interior of the enclosure and operatively coupled with the network switch, and a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch. The process controller is configured to send an add-on profile (AOP) program to a processor to define data to be exchanged between the IED of the electrical automation system and the process controller in a communication stream over a networked communications protocol according to information from an electronic data sheet (EDS) file corresponding to the IED.

Yet another disclosed example includes a system to interface a process automation system including one or more process automation system devices connected to a first network with an electrical automation system including an intelligent electrical device (IED) connected to a second network. The apparatus comprises an enclosure with an interior, a network switch disposed in the interior of the enclosure and operatively coupled with the first network, a process controller disposed in the interior of the enclosure and operatively coupled with the network switch, and a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch, a high accuracy timing device in communication with the switch. The high accuracy timing device configured for distributing a time signal through the first network operatively coupled with the process controller of the process automation system, and distributing the time signal through the second network operatively coupled with the IED of the electrical automation system.

DETAILED DESCRIPTION

Figure 11:
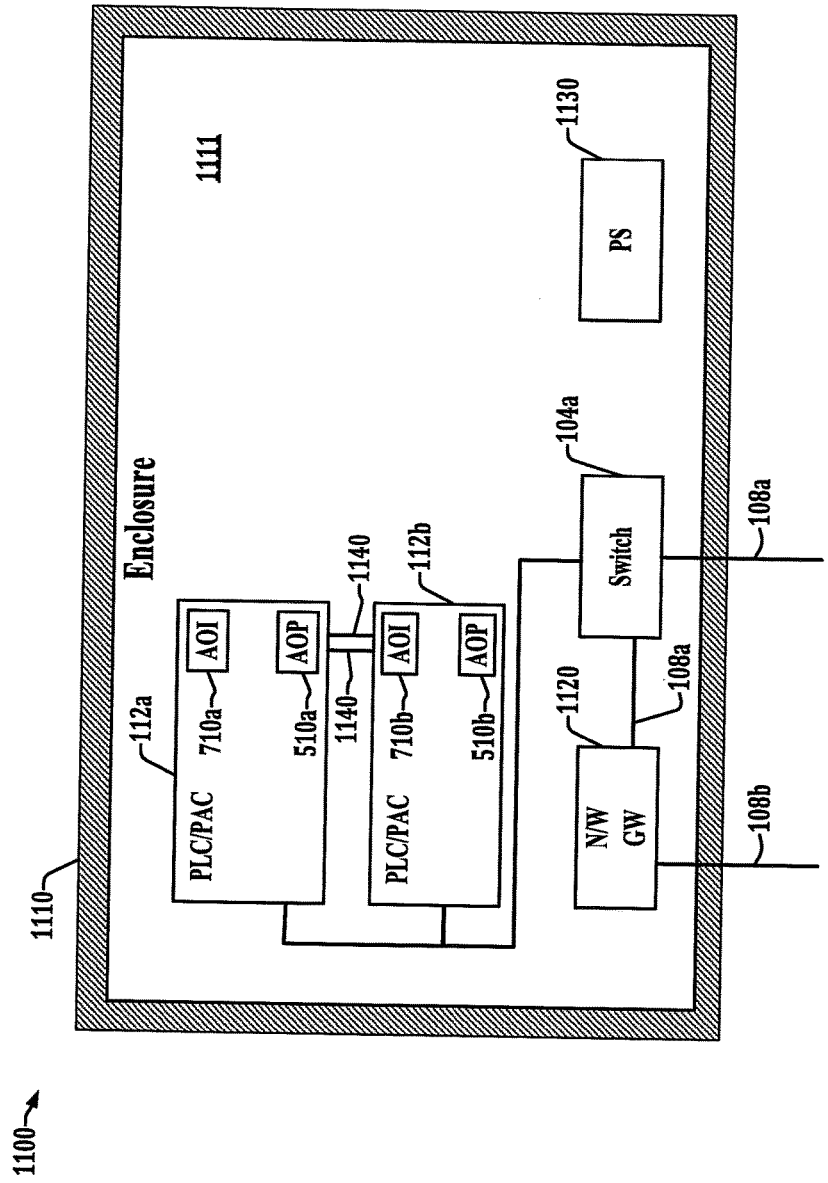
FIG. 11 shows an embodiment of an interface apparatus with an enclosure.

Referring initially to FIG. 11, interface apparatus 1100 is shown. FIG. 11 also shows enclosure 1110 including an interior 1111. The enclosure 1110 may include a door to the interior 1111 (not shown). Interior 1111 may include, for example, programmable logic controller (PLC) 112a, 112b or programmable automation controller (PAC) 112a, 112b. FIG. 11 also shows network (N/W) gateway (GW) 1120, switch 104a, power supply 1130, add-on instructions (AOI) 710a, 710b, add-on profiles (AOP) 510a, 510b, and first network 108a. The switch 104a may be, for example, an Ethernet switch. In one example, the interface apparatus may be an Allen-Bradley NEMA CENTERLINE 2100 MCC. In another example, the interface apparatus may be an Allen-Bradley IEC CENTERLINE 2500 MCC.

Figure 1:
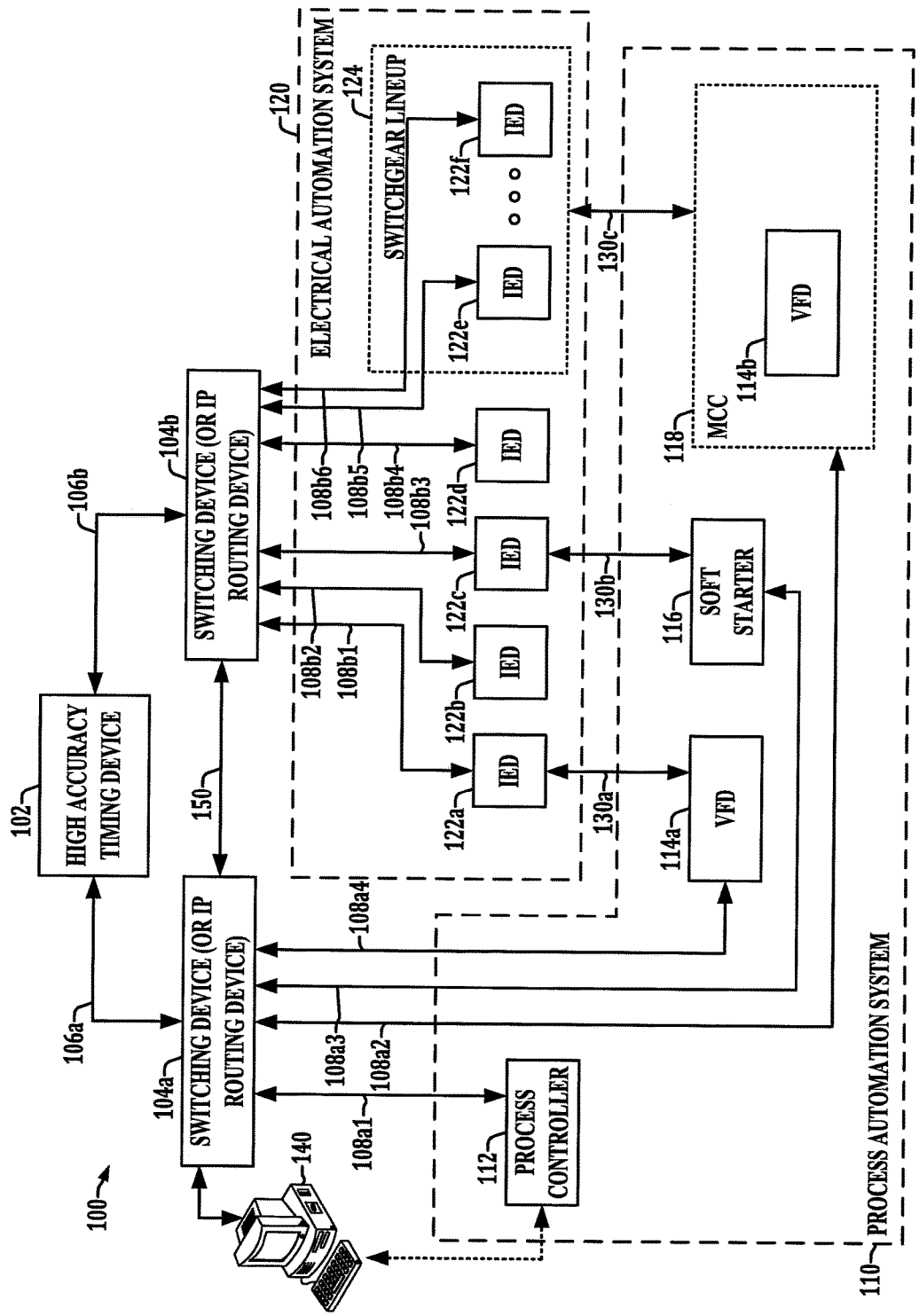
FIG. 1 is a schematic diagram of a connected enterprise including a process automation system with a process controller and an electrical automation system with a plurality of intelligent electrical devices (IEDs), as well as a high accuracy timing device to correlate timing of signals in first and second networks associated with the process automation system and the electrical automation system.

Referring now to FIGS. 1-4, systems 100, methods and apparatus are disclosed for interfacing process controllers 112 and other devices 114, 116, 118 in a process automation system or control space 110 with one or more intelligent electrical devices (IEDs) 122 of an electrical automation system 120 to facilitate implementation of process control decision-making and control actions in furtherance of process control goals as well as energy management goals. FIG. 1 shows an example connected enterprise system 100 including a process automation system 110 with a process controller 112 and an electrical automation system 120 with a plurality of intelligent electrical devices (IEDs) 122.

The process automation system 110 includes one or more control devices including a process controller 112, first and second variable frequency drives 114a and 114b, a soft starter 116, and a motor control center (MCC) 118 operatively coupled with a first network 108a. At least some of the process automation system devices 112, 114, 116, 118 are operative to control one or more processes (not shown), and the process automation system devices 112-118 in this example include network connections 108a1, 108a2, 108a3 and 108a4 for exchanging data there between and with other networks via a first router or other switching device 104a. The first switching device 104a in this example is operatively connected with a computer or other processor 140 to provide communications capability between the processor 140 and the process controller 112 and other devices 114-118 of the process automation system 110.

The electrical automation system 120 includes IEDs 122a, 122b, 122c, 122d, 122e and 122f that are operatively coupled with a second network 108b and an associated second router or second switching device 104b via network connections 108b1, 108b2, 108b3, 108b4, 108b5 and 108b6. In this example, two of the IEDs 122e and 122f are included within a switchgear lineup 124. In operation, the IEDs 122 provide power to the process automation system 110, and certain of the IEDs 122a, 122c and the switchgear lineup 124 are operatively associated with the VFD 114a, the soft starter 116 and the MCC 118, respectively, by connections 130a, 130b and 130c. Any suitable network configurations, topologies, and protocols can be used for the networks 108a and 108b, including without limitation Ethernet type networks. The networks 108, moreover, can individually include any form of connections or nodes, such as wired network nodes, fiber network nodes and/or wireless network nodes.

The connected enterprise system 100 in FIGS. 1-4 further includes a high accuracy timing device 102 to correlate timing of signals in the first and second networks 108a and 108b. The timing device 102 is operatively coupled with the switching devices 104a and 104b in one example via suitable communications interconnections 106a and 106b. In certain examples, moreover, the routers or switching devices 104 are communicatively coupled with one another via a communications connection 150. In operation, the timing device 102 distributes a time signal to at least some of the control devices 112, 114, 116, 118 through the first network 108a, and distributes the time signal to at least some of the IEDs 122 through the second network 108b via the routers 104a and 104b. In certain examples, the timing device 102 is a GPS receiver. Other implementations of a timing device 102 are possible, including without limitation a precision time protocol (PTP) master clock server, a network time protocol (NTP) server, a fly wheel converter technology device, or a simple network time protocol (SNTP) server. Distribution of the time signal from the timing device 102 provides time synchronization that facilitates intelligent energy management decision-making and actions by at least one of the control devices 112, 114, 116, 118 in conjunction with process control decision-making and actions. In addition, the time signal is distributed in certain examples from the timing device 102 over a standard Ethernet communication media 108 of the first and second networks, which can individually include wired, wireless, fiber optic and/or other network technologies.

Figure 2:
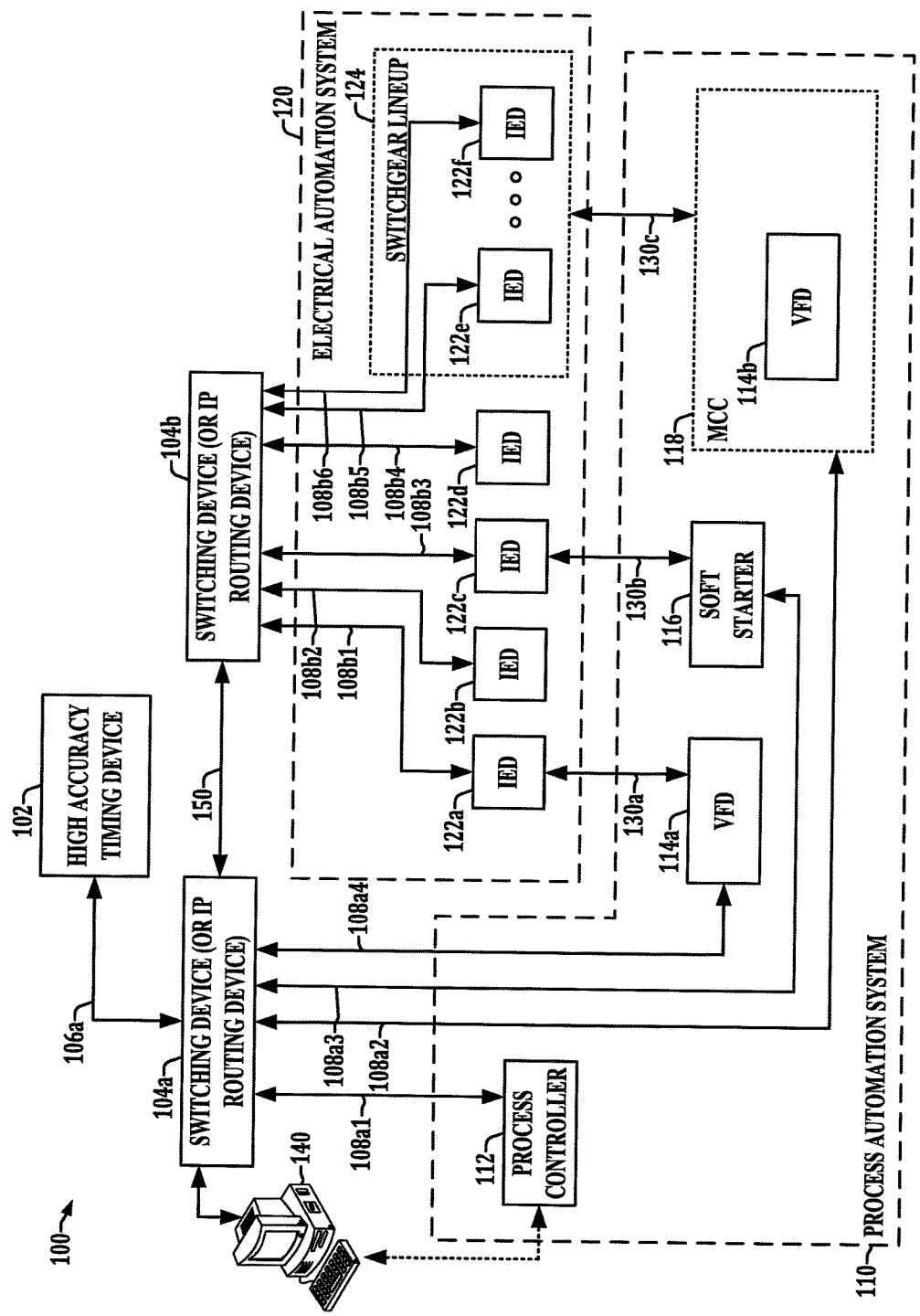
FIG. 2 is a schematic diagram of another example connected enterprise in which the high accuracy timing device is connected with the first switching device and the time signal is distributed to the first network via the first switching device, and the high accuracy timing device is connected to the second network via the second switching device.
Figure 3:
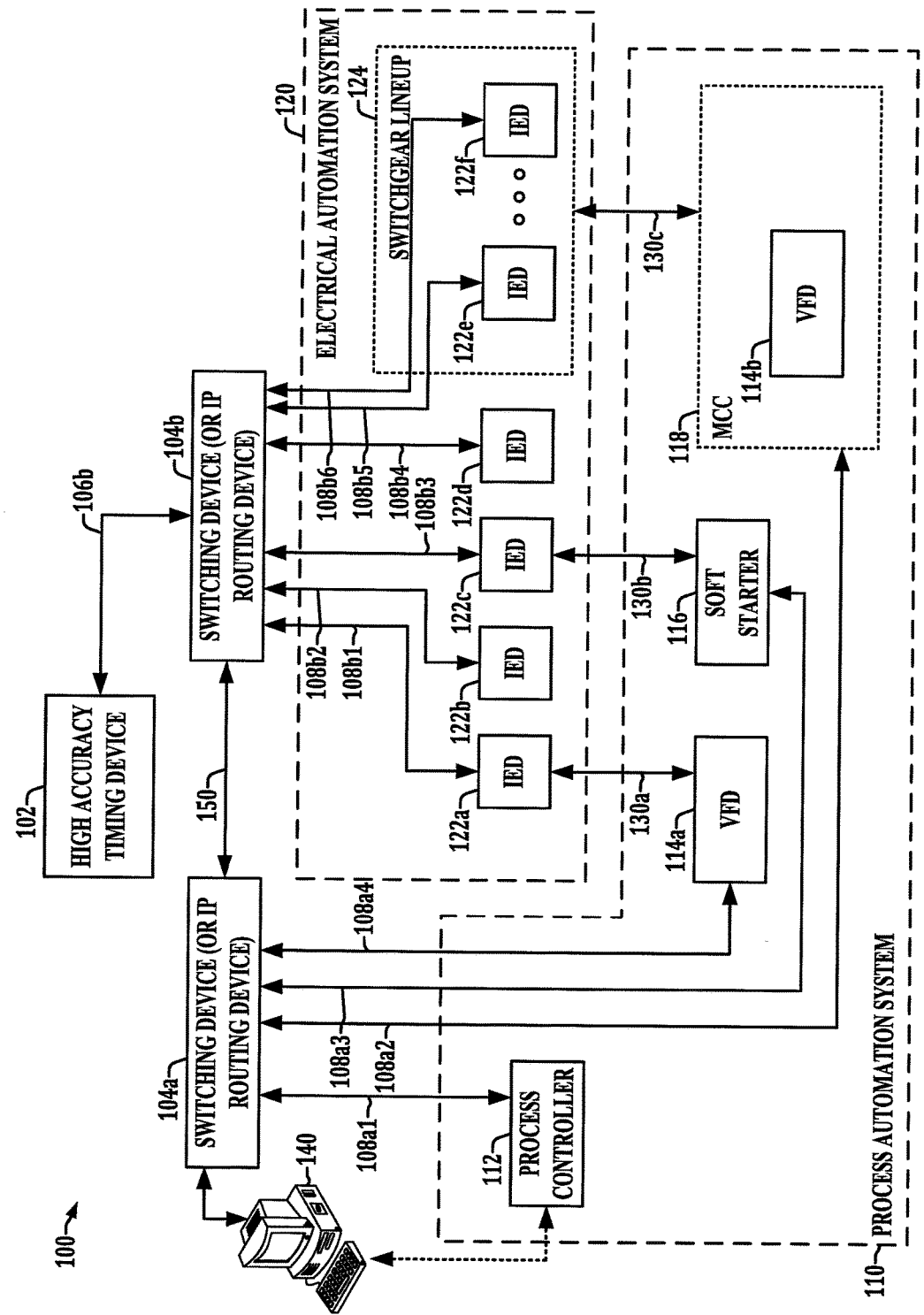
FIG. 3 is a schematic diagram of another example connected enterprise in which the high accuracy timing device is coupled with the second switching device to distribute the time signal to the second network, and the high accuracy timing device is coupled to distribute the time signal through the first switching device to the first network.
Figure 4:
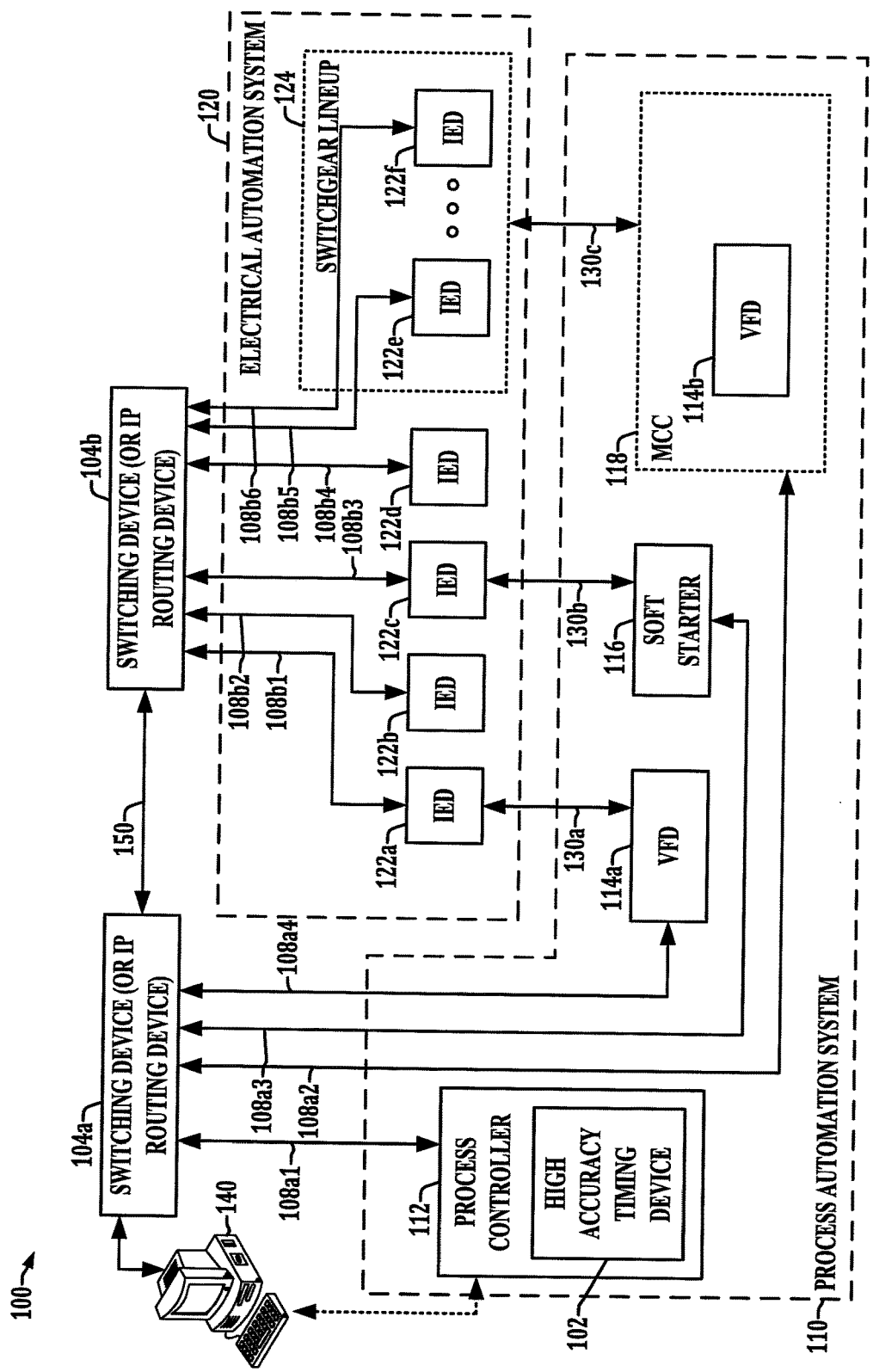
FIG. 4 is a schematic diagram of another example connected enterprise in which the high accuracy timing device is implemented in the process controller of the process automation system.

In the example of FIG. 1, the timing device 102 is connected to the first switching device 104a as well as to the second switching device 104b via corresponding communications connections 106a and 106b. FIG. 2 shows another example configuration, in which the high accuracy timing device 102 is connected with the first switching device 104a via a connection 106a, and the time signal is distributed to the first network 108a via the first switching device 104a, and to the second network 108b via the router connection 150 and the second switching device 104b. In FIG. 3, the timing device 102 is coupled via connection 106b with the second switching device 104b to distribute the time signal to the second network 108b via the switching device 104b, and to distribute the time signal through the connection 150 and the first switching device 104a to the first network 108a. FIG. 4 illustrates another example in which the timing device 102 is implemented in the process controller 112 of the process automation system 110. In this case, the time signal from the high accuracy timing device 102 is distributed from the process controller 112 to the switching devices 104a, 104b and the other devices of the first and second networks 108a and 108b.

Figure 5:
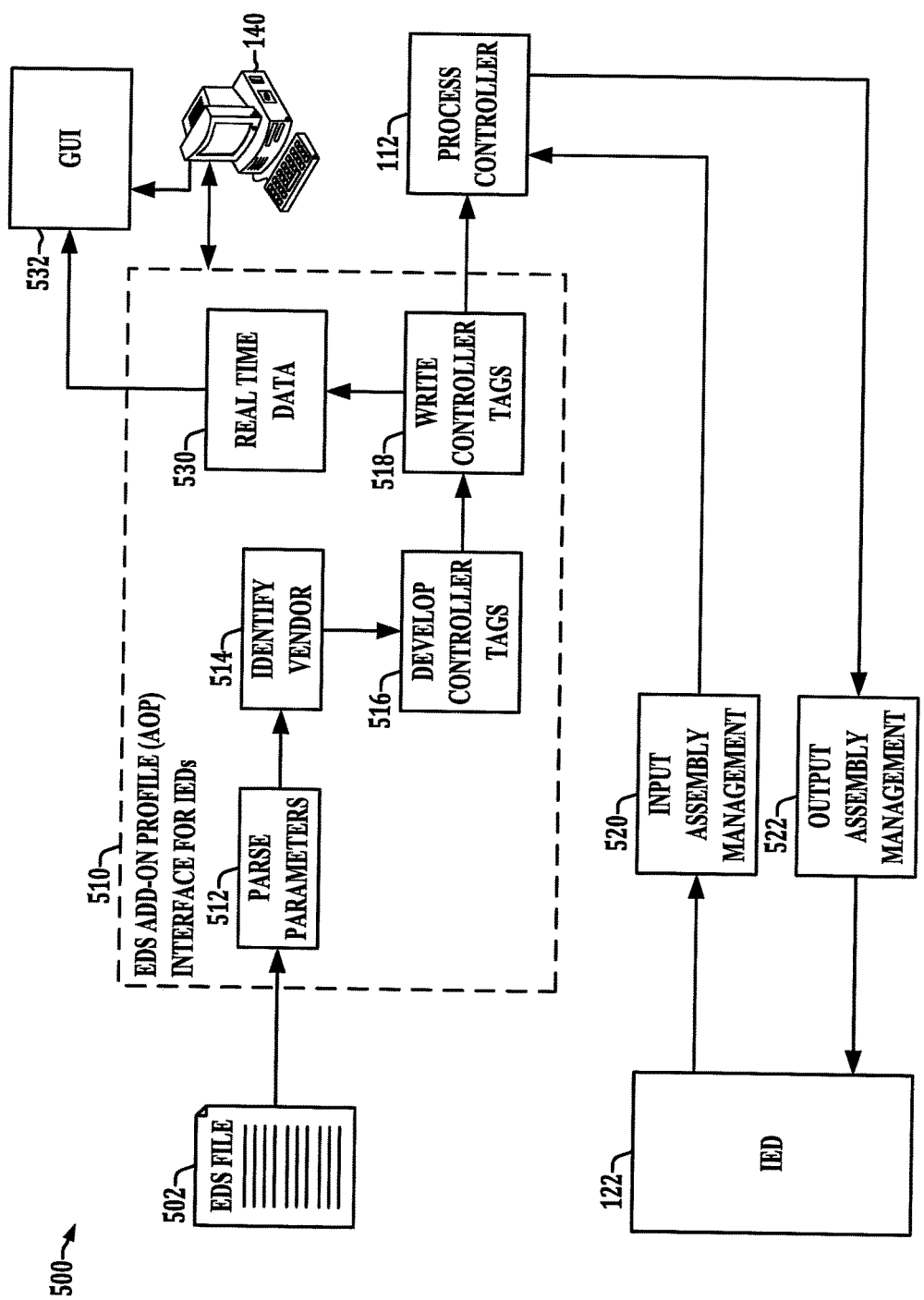
FIG. 5 is a schematic diagram illustrating an add-on profile (AOP) interface for IEDs.
Figure 6:
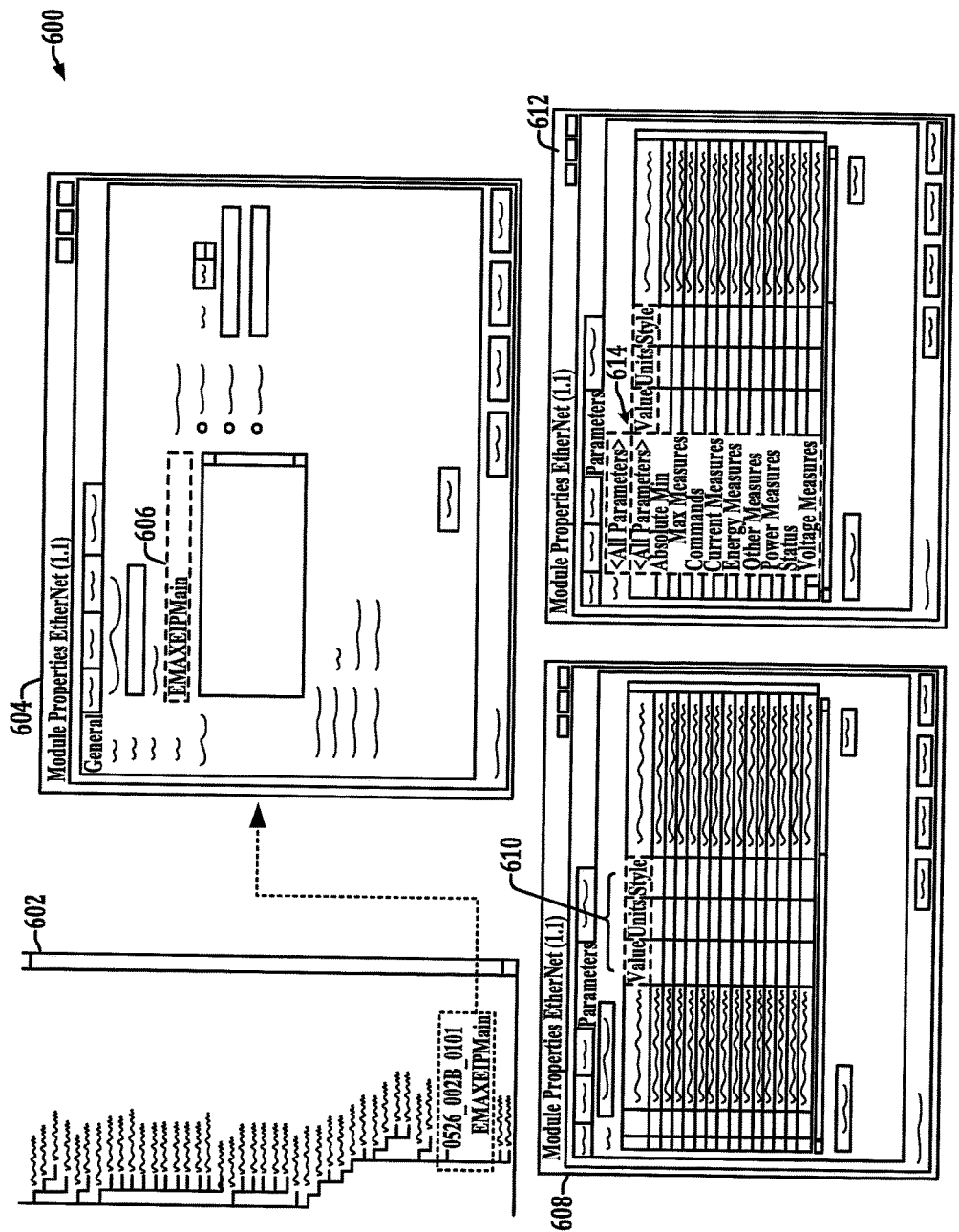
FIG. 6 is a schematic diagram illustrating various graphical user interface (GUI) renderings showing display screens in the example connected enterprises.
Figure 7:
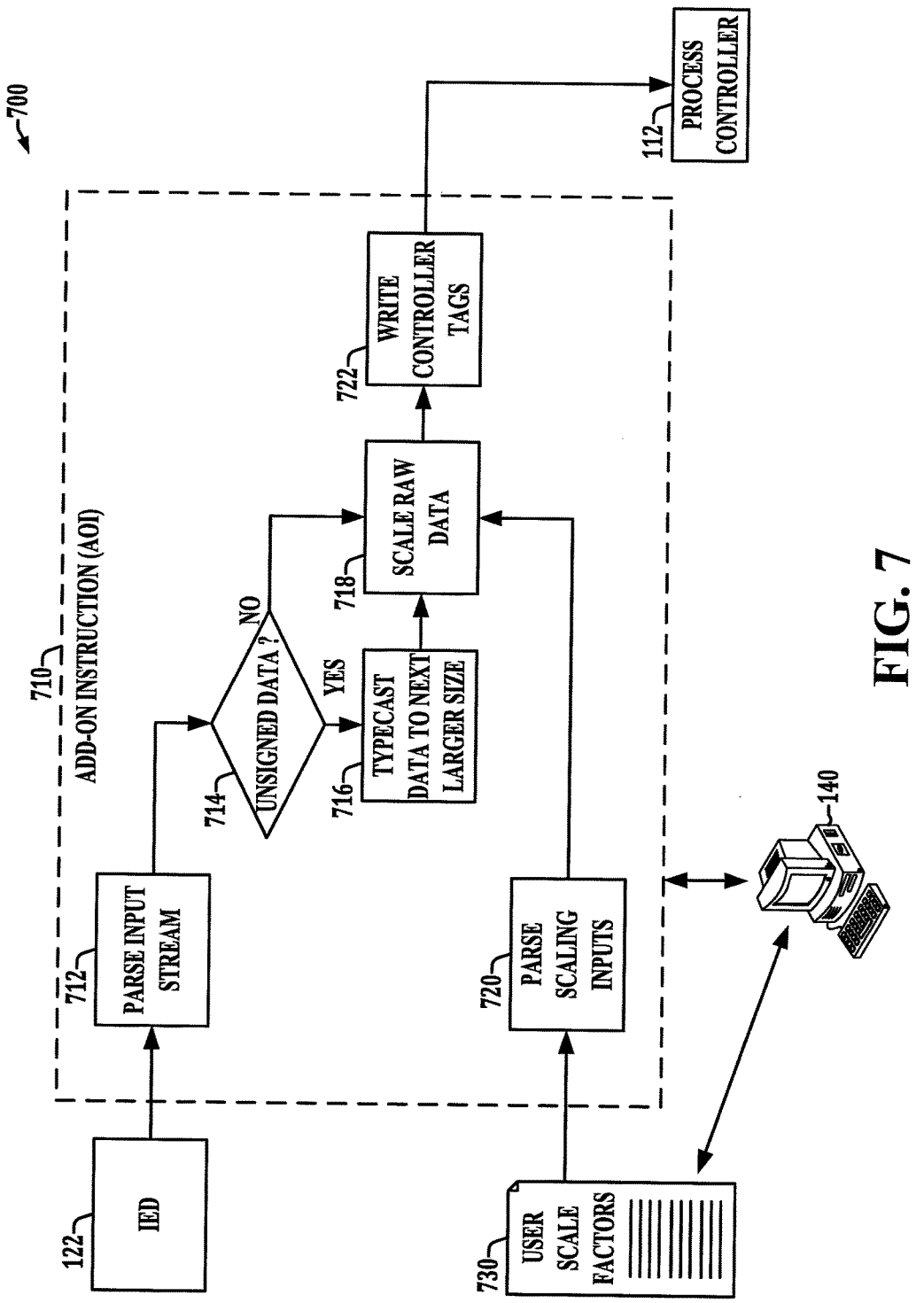
FIG. 7 is a schematic diagram illustrating an add-on instruction (AOI) implemented by the process controller in the connected enterprises.

Referring also to FIGS. 5-7, in addition to time synchronization, the disclosed examples further include execution of an ad-on profile (AOP) 510 (FIGS. 5 and 6) (e.g., executed by the processor 140 in FIGS. 1-4) to configure the process controller 112 to define data exchanged between an IED 122 of the electrical automation system 120 and the process controller 112, as well as execution in the process controller 112 of one or more ad-on instructions (AOIs) 710 (FIG. 7) to selectively convert unsigned data from the IED 122 into signed data and to scale the data from at least one of the IEDs 122 according to user-defined scale factors 730 to provide scaled data values for use by the process controller 112 in controlling at least one process. In these examples, operative interconnection of the process controller 112 with the first network 108a to obtain electrical control space information, along with the time synchronization between the networks 108a and 108b enables the process controller 112 to implement one or more process control goals, and to implement one or more energy management goals at least partially according to process control information and electrical control space information obtained from at least one of the intelligent electrical devices IEDs 122 of the electrical automation system 120. As detailed further below in connection with FIGS. 8-10, these capabilities facilitate system-wide intelligent energy management and process control not possible with conventional enterprise configurations in which the process control space and the electrical control space were effectively and independently operated.

FIG. 5 shows further details of an example AOP interface 510 for an IED 122. In one example, the processor 140 implements (e.g., executes) the EDS AOP 510 according to an electrical data sheet (EDS) file 502 provided by a manufacturer of a given IED 122. The processor 140 configures the process controller 122 using the AOP 510 to define data to be exchanged between a given IED 122 of the electrical automation system 120 and the process controller 112 in a communication stream over a networked communications protocol according to the electronic data sheet EDS file 502 corresponding to the given IED 122. The processor 140 in certain examples executes a number of EDS AOPs 510 each individually corresponding to an IED 122 according to a corresponding EDS file 502. In this manner, the process controller 112 is configured to communicate with one or more IEDs 122 of the electrical automation system 120. The networked communications protocol in one example includes at least one of IEC 61850 MMS, GOOSE, SV, DNP 3.0, IEC 60870-5, Modbus TCP, Ethernet/IP and DeviceNet. In addition, the communication stream can include any suitable form of messages or messaging, including Class 1 and/or Class 3 messages in certain examples.

In one example, the processor 140 in FIG. 5 implements the EDS AOP 510 in order to send a configuration packet or multiple packets to the process controller 112 defining the interface with the IED 122 according to the EDS file 502. At 512, the processor 140 receives or analyzes the EDS file 502 and parses parameters of the EDS file 502 in order to determine or identify parameters associated with the IED 122 that are of interest to the process controller 112. At 514, the processor 140 identifies the IED vendor from the first parameters, and reads controller tags from the EDS file 502 at 516. In one example, the tags represent parameters or values that will be exchanged between the IED 122 and the process controller 112 in operation. At 518, the processor 114 writes the identified controller tags to the process controller 112. In operation, the processor 114 may execute control monitoring programs by which the process controller 112 provides real-time data 530 according to one or more of the written controller tags, and the real-time data 530 can be monitored by a user of the processor 140 via a graphical user interface (GUI) 532 implemented by the processor 140. In this manner, the EDS AOP interface 510 configures the process controller 112 to exchange tags (e.g., parameters, values, etc.) with the IED 122 in real time operation to facilitate process control goals implemented by the process controller 112 as well as energy efficiency goals associated with an overall system. The tags written to the process controller 112 by the EDS AOP interface 510 in one example configure the process controller 112 to define how the data (e.g., tags) will be presented from the IED 122 to the process controller 112, and which parameters are expected from the IED 122.

In operation, the process controller 112 implements an input assembly 520 as well as an output assembly 522 based on the configuration parameters provided by the EDS AOP 510. The input assembly is the data stream coming from the IED 122 through the network connection to the process controller 112, and the output assembly is the data stream going from the process controller 112 to the IED 122 during real time operation. In one example, the input assembly data flow 520 and the output assembly data flow 522 are implemented using any suitable network technologies and protocols, such as Rockwell Ethernet/IP in one example.

Referring also to FIG. 6, and certain examples, moreover, the processor 140 executes the EDS AOP 510 to provide a graphical user interface (GUI) 532 (FIG. 5) including renderings in the form of user screens 600 for assignment of an IP address for the given IED 122, configuring a requested packet interval RPI for class 1 connections, and/or filtering of real time data tags from the given IED 122. FIG. 6 shows various GUI renderings in the form of display screens in the example connected enterprise system 100 above, including screenshot renderings 602, 604, 608 and 612 of the graphical user interface 532 which are available to the user of the processor 140 in FIG. 5. The user interface provides a navigable rendering 602 allowing a user to select among various devices or entities connected to the network 108, including an IED 122 for which the process controller 112 has been configured by the EDS AOP 510 according to a corresponding EDS file 502. Selection of a particular IED 122 in the listing of the rendering 602 provides the user with a corresponding rendering or screen 604 as shown in FIG. 6, in this example an air circuit breaker of the electrical automation system 120. The user can assign any desired name to the configured IED 122, and the screen 604 allows assignment of an IP address for communicating with the IED 122. The rendering or screen 608 shows the parameters obtained from the EDS file 502 for the selected IED 122. During real time operation, the parameters screen 608 allows the user to monitor live values via class 3 messaging from the IED 122 through the network(s) 108 to the process controller 112, along with the configured units and styles in the indicated columns 610 shown in FIG. 6. The parsing of the EDS parameters at 512 in the EDS AOP 510 of FIG. 5 populates the parameters screen rows including a tag or value name, units, style and description. The other column information is populated in the parameter screen 608 by class 1 messaging. The EDS AOP 510 also renders a connection tab that allows the user of the processor 140 to configure the (requested packet interval) timing (RPI) of packets transmitted through the network(s) 108 between the IED 122 and the process controller 112 for class 1 message exchange rate control. This allows configurable tradeoff between data latency to implement process and electrical system goals, and network bandwidth resources for data exchange.

The renderings 608 and 612 in FIG. 6 allow the user of the processor 140 to filter real-time data tags from the IED 122 within its environment. The EDS AOP 510 filters through the IED tags described in the EDS file 502. In one example, the EDS AOP 510 allows the user to view all the parameters parsed at 512 as shown in the screenshots 608 and 612, including the ability to sort the IED parameters using a drop-down list 614 to sort the parameters by absolute min/max measures, commands, current measures, energy measures, other measures, power measures, status or voltage measures. In practice, the EDS AOP 510 configures the process controller 112 with the parameters from the EDS file 502, and allows access by process monitoring software running in the external computer or processor 142 monitor real-time values for some or all of the IED parameters through a graphical user interface as shown in the example screens 608 and 612. In this example, the user can view a name, value, units, style and description for each individual parameter.

Referring also to FIG. 7, a schematic diagram 700 shows an add-on instruction (AOI) 710 according to further aspects of the present disclosure. In certain examples, the process controller 112 executes the AOI 710 to selectively convert unsigned data from the MD 122 into signed data. In one example, execution of the AOI 710 interfaces a signed data type to an industrial controller tag within a computing system environment. Execution of the AOI 710 also scales the data from at least one of the IEDs 122 according to user-defined scale factors 730 to provide scaled data values for use by the process controller 112 in controlling at least one process. In certain examples, the AOI 710 scales the data from at least one of the IEDs 122 in the form of unsigned integers to signed real values or floating point values. The AOI 710 in FIG. 7 is implemented by the process controller 112, and is configured according to the EDS file 502 and/or user scale factors 730. In one example, the AOI 710 is implemented as added instructions to ladder logic programming code implemented or executed by the process controller 112 in real time in order to process the input assembly management data received from the IED 122 across the network or networks 108. In the illustrated example, moreover, the AOI 710 implements conversion of unsigned data from the IED 122 into signed data for consumption by the process controller 112. The AOI 710 parses the incoming data stream from the IED 122 at 712, and determines at 714 whether any of the IED data is unsigned. In this regard, certain IEDs 122 may provide unsigned binary data for one or more parameters identified in the EDS file 502. In one example, the IED 122 may provide unsigned integer values to represent a range for a given parameter that may include both positive and negative numbers. The AOI 710 identifies these as unsigned data at 714. The process controller 112, on the other hand, may be configured to operate unsigned data. Accordingly, the AOI converts any unsigned data from the IED 122 into signed data for use by the process controller 112. In this manner, potentially large unsigned values from IEDs 122 will not be misinterpreted by the process controller 112 as very large negative numbers. If any of the data is unsigned (YES at 714), the AOI 710 type casts the data to a next larger size at 716. For example, an unsigned 8-bit data word is typecast at 716 to be a 16-bit signed data word. In another example, an unsigned 16-bit data word is typecast at 716 to be a 32 bit signed data word. The scaling up at 716 facilitates addition of a signed bit to the data without loss of resolution.

In one example, the AOI 710 uses information from the corresponding EDS file 502 to determine which values of the input stream from the IED 122 are known to be unsigned values. In pursing a given input stream at 712, the AOI 710 is executed to selectively typecast unsigned data values at 714 and 716 to accommodate IEDs 122 that may provide unsigned data values. In this regard, the EDS file 502 defines the data formatting for all the parameters provided by the corresponding IED 122, including whether or not a given parameter is formatted as an unsigned data value.

At 718, the AOI 710 scales the raw data according to scaling inputs parsed at 720 from the user scale factors 730. The AOI 710 than writes the scaled controller tags or data parameters to the process controller 112 at 722. The parameter values are received from the IED 122 as integers. The user scale factors 730 convert the input IED data from integers to real numbers such as engineering units, and are provided to configure the AOI 710 by user input via the processor 140. The AOI 710 in one example receives user inputs 730 for voltage scaling factors, current scaling factors, and all other parameters provided by the IED 122. In executing the AOI 710, the process controller 112 uses the user scale factors 730 to scale the raw IED input data at 718 (directly or after typecasting of unsigned data at 716). The scaled data values or tags are written to the process controller 112 at 722. In one example, the process controller 112 implements one or more process control functions to implement process goals as well as energy goals, and the AOI 710 provides the scaled controller tags at 722 to predetermined memory locations of the process controller 112 for use and consumption by the process control functions implemented in the controller 112. For example, the process control function or instructions and the AOI 710 can be software modules implemented on a single processor of the process controller 112, with the AOI 710 passing scaled data values as controller tags for consumption by the process control instructions. The scaling factors 730 can be input by a user of the processor 140 during configuration of the process controller 112 for a particular IED 122 upon assessing the IED parameters shown in the GUI renderings 608, 612 in FIG. 6. In certain examples, the IED AOP 510 determines one or more of the scaling factors 730 and stores these in the memory of the process controller 112, such as a controller data table for use in operation of the process controller 112 to implement one or more process control and/or energy management goals. The controller data table in one example allows a control program to operate according to the scaled data value or values, and the values may be accessed by other devices on the network(s) 108 for data monitoring or other uses. In one example, as mentioned above, the scaled values can be monitored in real time by the processor 140 and rendered to a user via the GUI screens 608 and 612 in FIG. 6. In practice, one AOI 710 is configured in the process controller 112 for each configured IED 122 on the network.

Figure 8:
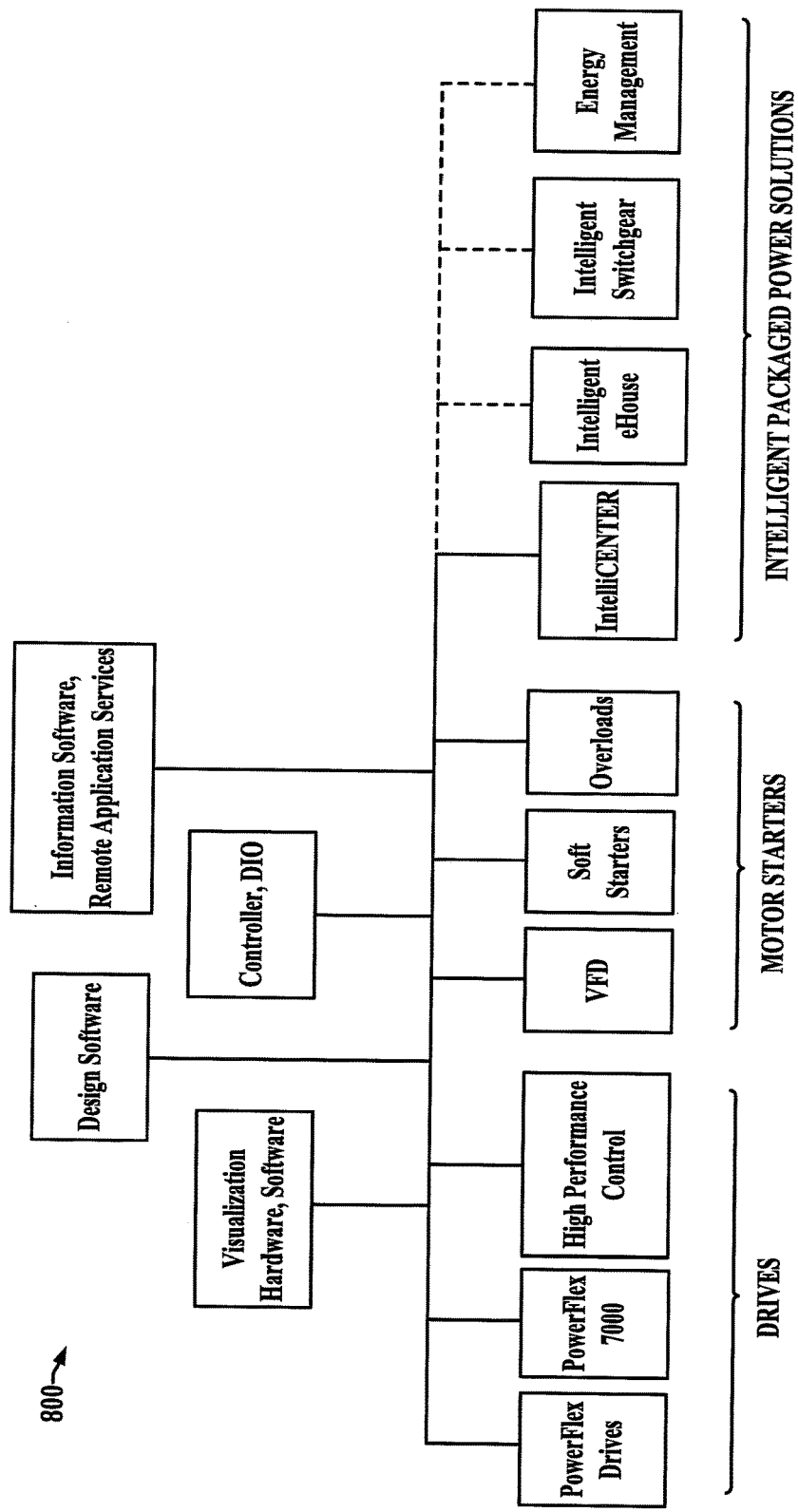
FIG. 8 shows a connected enterprise.

FIG. 8 shows another example connected enterprise system 800. The connected enterprise 800 includes a process control space (e.g., process automation system 110 in FIGS. 1-4 above), with motor drives, motor starters and other control actuators, overloads, control logic and associated devices to control one or more processes. In addition, the connected enterprise system 800 in FIG. 8 includes an electrical control space (e.g., electrical automation system 120 in FIGS. 1-4) with switchgear and other apparatus for controlling power distribution and other functions, as well as an energy management system. These system components are operatively, communicatively, interconnected by way of one or more networks such as Ethernet networks the, first and second networks 108*a* and 108*b* above). The connected enterprise system 800 includes a variety of devices and control centers operatively coupled with one another through an integrated architecture using one or more communication protocols and intelligent devices. Disclosed examples extend connected enterprises and the control space thereof with an electrical automation system space of the enterprise to facilitate intelligent electrical space operation and intelligent power management according to process control space operations and considerations through time synchronization in the networks 108, the use of an AOP 510 to configure the process controller 112 to receive data from a given IED 122 and/or by execution of an AOI 710 by the process controller in order to process data from the IED 122. The process automation system components serve manufacturing process devices and implement process control computations and actions to achieve manufacturing or production goals (i.e., process control goals). The electrical automation system implements power distribution for the enterprise (e.g., plant or facility) to connect the enterprise systems and devices with grid power or power from auxiliary sources (e.g., wind, solar, fuel cell, geo-thermal, etc) and controls the switchgear and power distribution devices upstream from the process perspective.

The connected enterprise system 800 provides a packaged power system including intelligent control space controllers and components that implement process control features as well as power management features for interfacing with the electrical space systems for intelligent power management and process control. The disclosed embodiments provide a packaged power solution that enables adjacent intelligent electrical devices to integrate into the connected enterprise platform. Certain embodiments include single communication and control infrastructure for electrical and automation systems. In one example, EtherNet/IP and IEC 61850 protocols can be used over unmodified Ethernet network interconnections to interface the electrical control space and the process control space, for example with electrical substation monitoring and control added to a Logix control architecture system such as those manufactured by Rockwell Automation. In addition, certain embodiments provide synchronization of facility wide data on the same clock to provide high accuracy time stamping. This feature, in turn, facilitates intelligent energy management decision-making and actions in conjunction with precise process control capabilities.

Disclosed embodiments tie the process control space and electrical control space systems together to enhance the connected enterprise concept, for example, using Ethernet/IP and 61850 networks or other suitable network technologies and protocols. This operative interconnection enables control spaces devices and processes to participate in decision-making for actions taken in the electrical space. For example, the control space can control a process so as to prevent one or more controlled processes from being powered down during an electrical space load shedding action, and instead selectively participate in load shedding selections and/or control space power reduction actions through process control actions to facilitate load shedding goals while also facilitate process control goals. The process control actions can thus be tailored in consideration of energy management goals and vice versa. The control devices in the process space can manage the process(es) in a proactive way to drive efficiency, cost savings and other power management goals.

Switchgear in the electrical control space includes power switching devices, such as circuit breakers, that control provision of electrical energy to various portions and pieces of a plant or facility. For instance, switchgear might have 20 different circuit breakers feeding 20 different processes, or feeding 20 different downstream loads. Energy management goals include load shedding and optimization, as well as intelligent source selection in view of efficiency and cost considerations, and process space controllers participate in energy management decisions and actions in the connected enterprise. Intelligent process control devices perform these tasks along with process control tasks in certain embodiments. In addition to power grid sources, other sources of energy can be controlled, in addition to selection from among a variety of power sources. Energy management information from intelligent devices and systems in the energy control space is accessible by process space controllers to provide an integrated approach to tying the electrical automation systems to the process automation space. By this interconnection and programming, the process space devices and systems can proactively perform actions, including process control adaptations or adjustments, on the process side to facilitate load shedding or other power distribution or energy management goals.

An energy management entity is networked together with a distributed control system (DCS) or process side equipment in the control space and switchgear is communicatively connected to both the DCS and the energy management component. The switchgear performs power switching, load shedding, power distribution, and other functions under control of either the energy management system or the process control system or both. In one example, the process control system receives a prompt from the energy management entity indicating that load shedding is desired. The process space control system determines whether process control actions can be taken or modified to reduce loading, and may also determine which, if any, controlled processes in the process space can be shut down in order to accommodate the load shedding request. In other embodiments, the process control system receives energy management information from intelligent devices in the electrical space, as well as information pertaining to energy cost schedules, information from power utilities regarding desired load reductions, information pertaining to availability of alternate energy sources (e.g., wind, solar, geothermal, etc.), and the process space controller(s) can proactively initiate process control modifications to reduce power consumption in one or more controlled processes, and/or decide which controlled processes can be shut down to accommodate load shedding goals. Disclosed embodiments thus provide energy management-related information to process controllers and systems to facilitate intelligent energy management in a connected enterprise.

Figure 9:
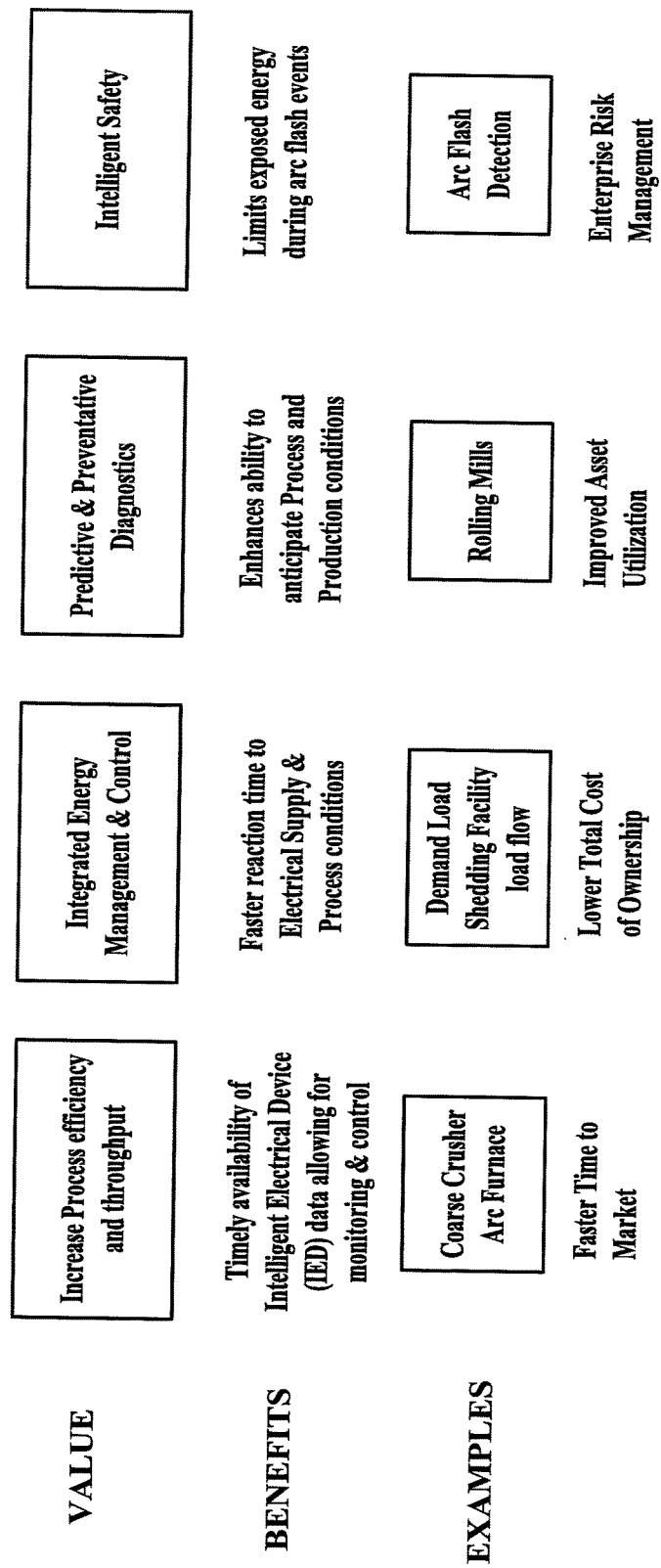
FIG. 9 further illustrates capabilities of certain examples.

FIG. 9 further illustrates a view 900 showing capabilities of certain embodiments. The Rockwell Automation Logix products can be advantageously employed in certain embodiments, providing significant scalability and data management capabilities to implement composite electrical control and process control features providing energy management advantages for a connected enterprise. Disclosed embodiments provide intelligent motor control and the capability of implementing partnering networks with electrical control space systems and any suitable form of separate or integrated intelligent power management systems. Moreover, described embodiments can be constructed using existing control space equipment modified to implement intelligent energy management functionality by operative interconnection with intelligent devices and other systems of an electrical control space (e.g., switchgear, power distribution control apparatus, etc.) and separate or integrated power management systems. The enhanced process control space capabilities provide agility for connected enterprise management within a business, as well as technical integration and differentiation with interconnected networks of potentially different protocols to construct a packaged power system potentially having components provided by multiple qualified suppliers.

In FIG. 9, various enhanced capabilities of the packaged power systems and techniques are shown with associated value, benefits and examples. The first involves providing data from the electrical space into the process control space and vice versa. This increases the efficiency throughput of that access system. In one example, this is accomplished by synchronizing deterministic type data from the electrical device. The synchronized information from the electrical control space can be used for any purpose by the process control space controllers, such as monitoring or taking/modifying a process control action, etc. the process controllers must have process control information as well as data from the electrical distribution space, allowing the process control or automation space systems to close process loops or react accordingly.

The second example in FIG. 9 involves integrated energy control, providing the ability of process space controllers to react to management from an energy standpoint. This feature is facilitated in some examples by the increased availability of electrical control space data from the first example. Using this information, the process space controllers can make smart energy decisions or react according to changing energy or power distribution conditions based on information from the electrical control space. One non-limiting example is for load shedding or facility load flow. Load shedding includes shutting down portions of the switchgear of the electrical distribution space based on need or conditions or events in the automation space. If there is a large amount of energy, electricity, coming into the system, and something is amiss, issues may occur downstream that start tripping breakers due to excessive current draw. Alternatively, if there is some kind of fault condition, the process space system can initiate a reaction upstream in the distribution space before having to shut down the whole plant. The packaged power system is thus able to provide intelligent reaction based on the process data to facilitate process as well as energy management goals.

For load shedding and other load management goals, the system uses the switchgear to implement dynamic load based shedding based on informed demand information based on the process data. For example, if a utility is requesting load shedding, the process space system can potentially slow down a conveyor line or take other process control actions (e.g., within acceptable process control parameters) to reduce current draw and thereby reduce energy consumption. In this manner, the system can intelligently select between reduced energy operation of the process control space or shutting down non-critical process control space loads to facilitate energy management goals while still achieving desired process space goals. In this regard, many energy management goals and processes, such as selective load shedding or load reduction have sufficient lead time before actions must be taken to allow the process control space systems to act accordingly. Moreover, synchronization of information from the electrical control space as well as time-dependent request from utilities and other energy management system components facilitates quick response by the process control space equipment to achieve these goals.

In another example, an industrial facilities manager of a facility consuming large amounts of energy, such as for a steel mill, oil refinery or mining site, etc., can proactively initiate load shedding or energy consumption reduction using the process control space equipment in order to reduce consumption during peak demand windows or other conditions in which the price of energy is high. In certain embodiments, the process control space equipment interrogates or otherwise gathers information from the electric distribution system, where the facility is going to be metering to proactively communicate between these electrical control and process control devices (e.g., MCC units, drives, spark conveyor systems, etc.) and adjust one or more controlled processes to achieve a "low energy" state. As part of this, the system can determine which processes might not be critical, and potentially shut these down for all or a portion of a peak demand time period. In this manner, the system can proactively save energy and as well as cost for the end user. This capability is unlike conventional electrical control space equipment which is essentially binary, i.e., either turning on loads or turning off loads. Moreover, this capability mitigates or avoids potential safety or end product scrap by identifying loads associated with controlled processes in which partially manufactured goods would be scrapped if the process were shut down arbitrarily, or for specific processes were safety concerns could be compromised by arbitrarily shutting down the process.

The system can also provide an energy view including data and/or graphical representations for use by a facilities manager to consolidate process control information as well as electrical space information, which can be supplemented with energy management information. The system thus provides facilities management with improved tools for managing an entire plant or multiple plants. The system further provides an interface allowing management to initiate proactive adjustments in the process control and/or electrical control spaces for any number of purposes, including without limitation, energy management goals. Furthermore, the process control space systems can be configured by management or other user with rule sets and other algorithmic for role-based logic for implementing energy management goals and/or specific process control goals. The user is thus presented with a true plan-wide energy operation view from one or more energy sources (e.g., utilities, on-site solar power sources, geothermal energy sources, wind power sources, on-site chargeable battery banks, etc.) down through the power distribution architecture to the individual process control devices and equipment. In this manner the process control space control equipment can be used in certain examples as a data aggregator for providing consolidate information regarding energy consumption as well as process control states, machine status information, etc. In another non-limiting example, a melting furnace can be adjusted empirically based on such a graphical rendering, or algorithmically in order to operate at a more efficient rate.

In the third example of FIG. 9, the system also facilitates predictive diagnostics. In particular, the process space control system can gather and analyze status and other information regarding intelligent devices in the electrical control space. Thus, whereas prior systems do not provide an integrated plan-wide prognosis or diagnosis framework, the packaged power system approach facilitates using both predictive and preventative diagnostics using information from the process control space as well as from the electrical control space. In this manner, if one or more components in the electrical control space can be identified as being degraded or likely to become degraded, proactive maintenance can be scheduled. In particular, intelligent devices can provide data through the interface to the process space control system, with which the system can predict wear over time and take one or more remedial measures.

The fourth example in FIG. 9 relates to Arc Flash Detection or detection of other potential hazard condition, in both the process control space and the electrical control space. In one example, detection or prediction of an arc flash condition in a process control device and/or in an electrical control space device can be signaled through the network to the process control space control equipment. The system can react by signaling an upstream overload relay in order to prevent or mitigate an arc flash condition before it happens, or before the damage becomes significant. This represents a significant improvement over purely reactionary actions by conventional electrical control space devices (e.g., tripping breakers based on excessive current draw).

The system, including the network interfacing, provides a unified network in a control architecture that can adapt the information from multiple control domains or spaces, and provides for synchronizing the information for intelligent decision-making and actions in either domain. In this manner, data from the electrical control spaces correlated with data from the process control space and vice versa. To do this, any suitable synchronization protocol can be used, including IEEE synchronization protocols, and protocols and synchronization models adopted for the IEC 61850 network technology. Thus, the disclosed process control space control equipment advantageously employs information from both domains, and assesses both energy consumption as well as device health/status in both domains, and implements energy management goals, as well as diagnostic/system maintenance goals, in addition to process control goals.

Figure 10:
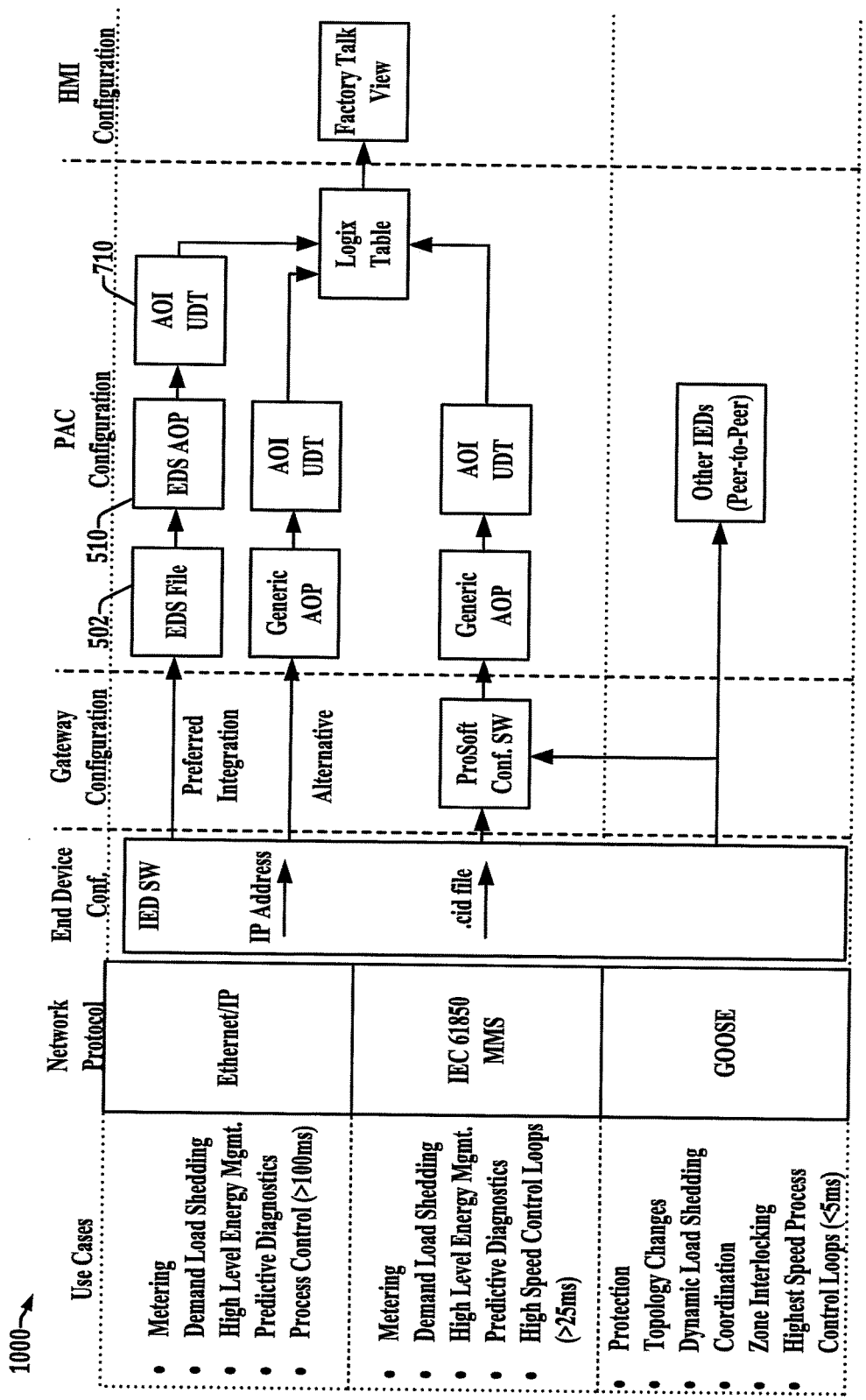
FIG. 10 shows packaged power use case examples.

FIG. 10 shows an overview 1000 of packaged power use case examples. This example uses EtherNet/IP and IEC 61850 protocols over an unmodified Ethernet operating in a stable & reliable manner, and employs a system reference architecture incorporating both protocols. The interface also supports EMAX2 EKIP COM Ethernet/IP modules using unsigned data types, and provides support to direct or indirect unsigned data in the process control space. One implementation integrates devices using AOPs by developing the code in the form on an AOI copy EMAX2 raw data into Logix data types including: UINT (16 bit) as DINT (32 bit), UDINT (32 bit) as LINT (64 bits), Integration based on generic profile for EtherNet/IP devices, AOI would assign tag names to individual parameters in data table provided by EMAX2. In certain embodiments, the electrical control space equipment provides data formats for presentation to Rockwell automation Logix controller(s) in the process control space, including EMAX2 Ekip Module FW change to translate UINTs to DINTs, and the electrical control space equipment enables utilization of EDS AOP. Moreover, the system allows future development of custom AOP profiles, and may support SEL RTAC over EtherNet/IP.

FIG. 10 also demonstrates how both IEC 61850 and EtherNet/IP protocols are employed over a single medium on unmodified Ethernet creating a common system reference architecture for both power and process automation. This is accomplished by configuring the process controller of the process automation system to communicate with one or more IEDs (122) of the electrical automation system (120). The use of executing both add-on instructions (AOIs) and add-on profiles (AOPs) allows the controller to effectively define data to be exchanged between itself and a given IED or group of IEDs.

An IED communicating with a process controller over EtherNet/IP is accomplished with a networked communication stream and is interpreted according to the corresponding information from an electronic data sheet (EDS) file. The data can then be manipulated accordingly within RSLogix 5000.

An IED communicating with a process controller over IEC 61850 is accomplished through the use of a gateway module (and corresponding CID file) in which the networked communication stream is configured with a protocol that supports either Class 1 or 3 messaging. Through the use of executing an AOP, this provides a graphical user interface (GUI) with which to further configure and assign an IP address to a given IED. In addition, this also allows for configuration of a requested packet interval (RPI) for class 1 connections and also filtering of real time data tags. The data can then be manipulated accordingly within RSLogix 5000.

Additional, disclosed examples include an interface bucket apparatus for a Motor Control Center (MCC) unit such as an Allen-Bradley NEMA CENTERLINE 2100 MCC, including an Ethernet switch, a controller such as a programmable logic controller (PLC) or a programmable automation controller (PAC) (or two redundant PLCs or PACs), as well as a DC power supply, and an IEC 61850 to EtherNet/IP or other network gateway module. Market trends have now pushed for single source suppliers of both infrastructure and automaton equipment to provide a 'more complete solution' to the end customer. The bucket will allow RA to easily to communicate to a number of various power automation devices within the industrial and commercial power system.

The interface bucket facilitates linking the power automation system with the process automation system. The apparatus can be employed to interface a distributed control system DCS with many different types of devices, including without limitation circuit breakers, meters, relays, etc. The PLC or PAC In or in one example is a Rockwell Control Logix Programmable Automation Controller (PAC) configured to communicate to these devices on a network interface. As many interfaced devices do not talk on native Common Industrial Protocol (CIP) protocols (e.g. EtherNet/IP, DeviceNet, etc.), the bucket apparatus of the NEMA MCC interfaces between these power automation devices and the PAC. The interface bucket apparatus may be housed in a 2100 NEMA MCC and in one example includes a port managed Ethernet switch, 2 redundant PACs, DC power supply, and IEC 61850 to EtherNet/IP gateway module. Moreover, the bucket apparatus in one example can be removed from the MCC cabinet. In other examples, the bucket is fixed, and cannot be easily removed from the MCC enclosure. In the case of a removable bucket apparatus, the bucket may be mounted on a withdraw for, or have other withdraw features to facilitate removal, replacement and/or relocation within the housing structure. And one example, network cabling or connections for IEC 61850 devices are connected to the Ethernet switch in the bucket apparatus. Data presented from the IEDs to the PAC is translated by the gateway module to standard EtherNet/IP messaging. When data is translated from the PAC to the IEC 61850 end device, the data is passed though the gateway to the end device. The bucket apparatus in one example can host a number of different power automation interfaces, including without limitation IEC 61850, IEC 60870-5, Modbus TCP, and/or DNP 3.0 LAN/WAN, etc. The bucket apparatus provides a beneficial linkage between the two domains of power and process automation. The apparatus facilitates clean integration between power automaton devices (IEDs, Circuit Breakers, Meters, etc.) and the Process Automation system (PAC). By providing this linkage, data is now available not only to be read by the controller, but also for command and control of these devices, all within a packaged NEMA MCC lineup enclosure. Moreover, the interface apparatus provides data interfacing for distributed control (e.g., supervisory control), as well as supervisory control of data acquisition (SCADA).

Additional disclosed examples include an interface bucket apparatus for a Motor Control Center (MCC) unit such as an Allen-Bradley IEC CENTERLINE 2500 MCC, including an Ethernet switch, a controller such as a programmable logic controller (PLC) or a programmable automation controller (PAC) (or two redundant PLCs or PACs), as well as a DC power supply, and an IEC 61850 to EtherNet/IP or other network gateway module. Market trends have now pushed for single source suppliers of both infrastructure and automaton equipment to provide a 'more complete solution' to the end customer. The bucket will allow RA to easily to communicate to a number of various power automation devices within the industrial and commercial power system.

The interface bucket facilitates linking the power automation system with the process automation system. The apparatus can be employed to interface a distributed control system DCS with many different types of devices, including without limitation circuit breakers, meters, relays, etc. The PLC or PAC In or in one example is a Rockwell Control Logix Programmable Automation Controller (PAC) configured to communicate to these devices on a network interface. As many interfaced devices do not talk on native Common Industrial Protocol (CIP) protocols (e.g. EtherNet/IP, DeviceNet, etc.), the bucket apparatus of the IEC MCC interfaces between these power automation devices and the PAC. The interface bucket apparatus is housed in a 2100 IEC MCC and in one example includes a port managed Ethernet switch, 2 redundant PACs, DC power supply, and IEC 61850 to EtherNet/IP gateway module. Moreover, the bucket apparatus in one example can be removed from the MCC cabinet. In other examples, the bucket is fixed, and cannot be easily removed from the MCC enclosure. In the case of a removable bucket apparatus, the bucket may be mounted on a withdraw for, or have other withdraw features to facilitate removal, replacement and/or relocation within the housing structure. And one example, network cabling or connections for IEC 61850 devices are connected to the Ethernet switch in the bucket apparatus. Data presented from the IEDs to the PAC is translated by the gateway module to standard EtherNet/IP messaging. When data is translated from the PAC to the IEC 61850 end device, the data is passed though the gateway to the end device. The bucket apparatus in one example can host a number of different power automation interfaces, including without limitation IEC 61850, IEC 60870-5, Modbus TCP, and/or DNP 3.0 LAN/WAN, etc. The bucket apparatus provides a beneficial linkage between the two domains of power and process automation. The apparatus facilitates clean integration between power automaton devices (LEDs, Circuit Breakers, Meters, etc.) and the Process Automation system (PAC). By providing this linkage, data is now available not only to be read by the controller, but also for command and control of these devices, all within a packaged IEC MCC lineup enclosure. Moreover, the interface apparatus provides data interfacing for distributed control (e.g., supervisory control), as well as supervisory control of data acquisition (SCADA).

Figure 12:
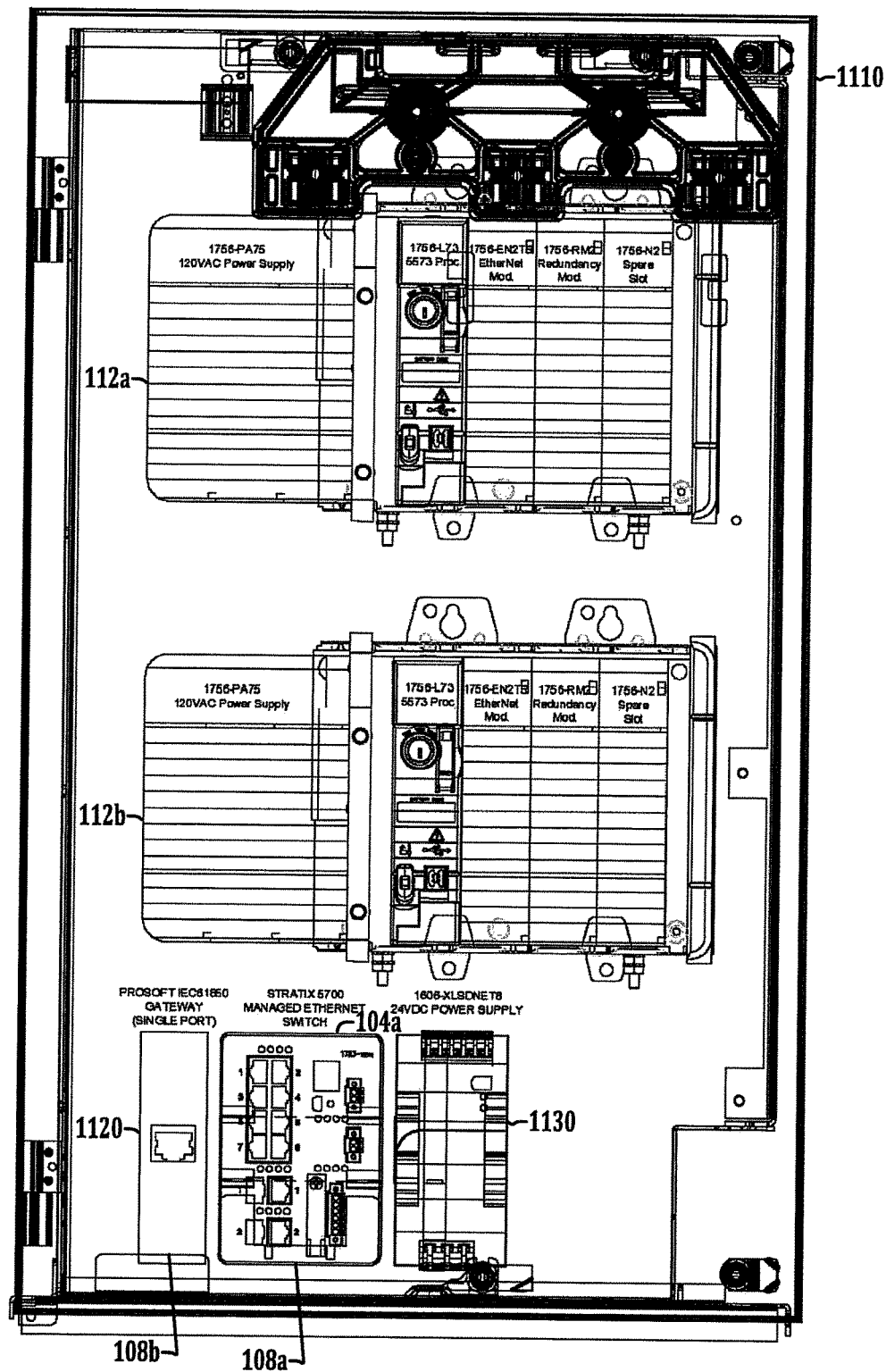
FIG. 12 shows an example of an interface apparatus including an enclosure with a redundant pair of process controllers, a network gateway, a network switch and a power supply.

FIG. 12 shows an example of enclosure 1110. The interconnections are not all shown. However, the redundant PLC racks 112a, 112b may be in communication via a fiber optic redundancy link. Network gateway 1120 is connected to the second network 108b, and may be in communication with the Ethernet switch 104a. Ethernet switch 104a is connected to the second network 108a. Power supply 1120 is also shown.

Figure 13:
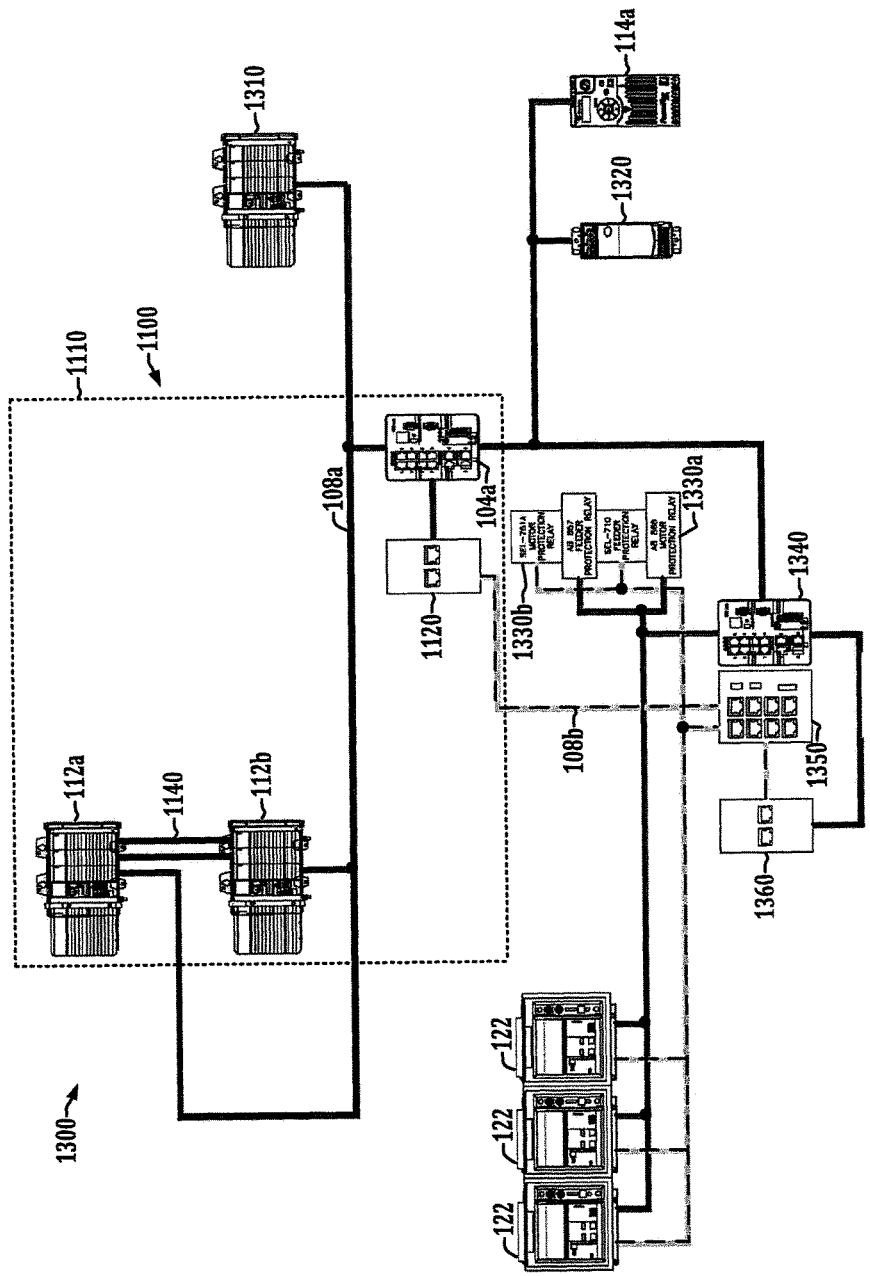
FIG. 13 is a schematic diagram of an example of a process automation system including an interface apparatus.

FIG. 13 shows process automation system 1300 including first network 108a, second network 108b, and fiber optic redundancy link 1140. Remote I/O PLC rack 1310, electronic overload relay 1320, relays 1330a, and Ethernet switch 1340 are connected to the first network 108a. Relays 1330b and IEC 61850 switch 1350 are connected to the second network 108b. IEC61850 Gateway (dual port) 1360 is connected to both the first and second networks 108a, 108b. In one example, the first network 108a is an Ethernet/IP network, and the second network 108b is an IEC61850 network. The process automation system 1300 thus shows an interface between process automation and electrical automation spaces. In addition, it should be noted that a large number of other topologies or configurations of electrical and process automation devices are possible, and are facilitated by the claimed apparatus.

Market trends have now pushed for single source suppliers of both infrastructure and automation equipment to provide a 'more complete solution' to the end customer. One area of this has been seen in single source suppliers of Motor Control Centers (MCCs) and switchgear, such as one or more circuit breakers. Additionally, customers want the ability to interface to the electrical automation system to provide command and control, as well as Supervisory Control and Data Acquisition (SCADA) energy data. A closed coupled switchgear and MCC Packaged Power offering apparatus 1100 is disclosed which provides these close coupled intelligent solutions, including switch gear such as an Intelligent Air Circuit Breaker (ACB), for example an ABB EMAX2 including electronic relay technology and an air circuit breaker, as well as an Intelligent MCC packaged in an enclosure such as a Rockwell Centerline 2100. The intelligent package 1100 provides the ability to interface to the intelligent air circuit breaker from a networked standpoint and provide a user interface to a Control Logix Controller (CLX) or other controller.

The CLX is able to provide command and control to the air circuit breaker. This complete closed coupled solution provides an Intelligent Packaged Power Lineup (IPPL) 1100 based on additive properties of technology in that 'Smart Device A'+'Smart Device B'=New technological innovation providing added customer value. Disclosed examples are shown in FIGS. 11-13, wherein the apparatus provides an Intelligent Packaged Power Lineup (IPPL) 1100 comprised of one or more 'Intelligent Air Circuit Breaker' switch gear devices in combination with one or more 'Intelligent Motor Control Centers'. In one example, the MCC and circuit breaker are housed in National Electrical Manufacturers Association (NEMA) enclosures as shown, such as Rockwell Centerline 2100 enclosures, or an Allen-Bradley NEMA CENTERLINE 2100 MCC with IntelliCENTER. The intelligent package includes embedded communication protocols within the product that allow for both SCADA and command and control functionality of the device itself. In one example, the circuit breaker is a low voltage circuit breaker, for example, one or more ACBs rated for 600 V operation or less. Previous low voltage air circuit breakers were either controlled by a hardwired relay or manual setting of the circuit breaker itself and commissioning.

The Intelligent MCCs can be provisioned for operation in association with multiple types of network technologies and protocols, including without limitation DeviceNet based MCCs, unmodified Ethernet, Ethernet/IP, IEC 61850, DNP3.0, etc. DeviceNet has largely been replaced with EtherNet/IP as a preferred communication methodology, and devices have been developed to communicate over unmodified Ethernet. These devices include drives, relays, PLCs, as well as others. Rockwell has developed the Intellicenter networked Intelligent MCC. The apparatus 1100 advantageously allows single source supply of both infrastructure and automation equipment to provide a 'more complete solution' to the end customer, particularly with respect to supply of switchgear and MCCs. Moreover, the apparatus 1100 facilitates the ability to interface the switch gear with a distributed control system (DCS) or other controller, allowing an electrical automation system to provide command and control, as well as SCADA energy data. In one example, the apparatus 1100 is configured as a Main-Tie-Main system that demonstrates the technology and network linkage between the CLX controller and various Air Circuit Breakers (ACBs) 1422. In other non-limiting examples, a Main configuration is provided. In another example, a Main-Main configuration is provided. The circuit breakers can be configured in any suitable arrangement.

By providing a complete intelligent packaged power lineup solution that is closed coupled, especially within the NEMA market, turnkey project solutions are facilitated for the process space as well as within the electrical automation space. In one example, the MCC includes a programmable logic controller (PLC) or a programmable automation controller (PAC) which uses the networked connection of the MCC with the ACB to read and control the circuit breaker within the switchgear/MCC apparatus 1100 for both process and power control.

Figure 14:
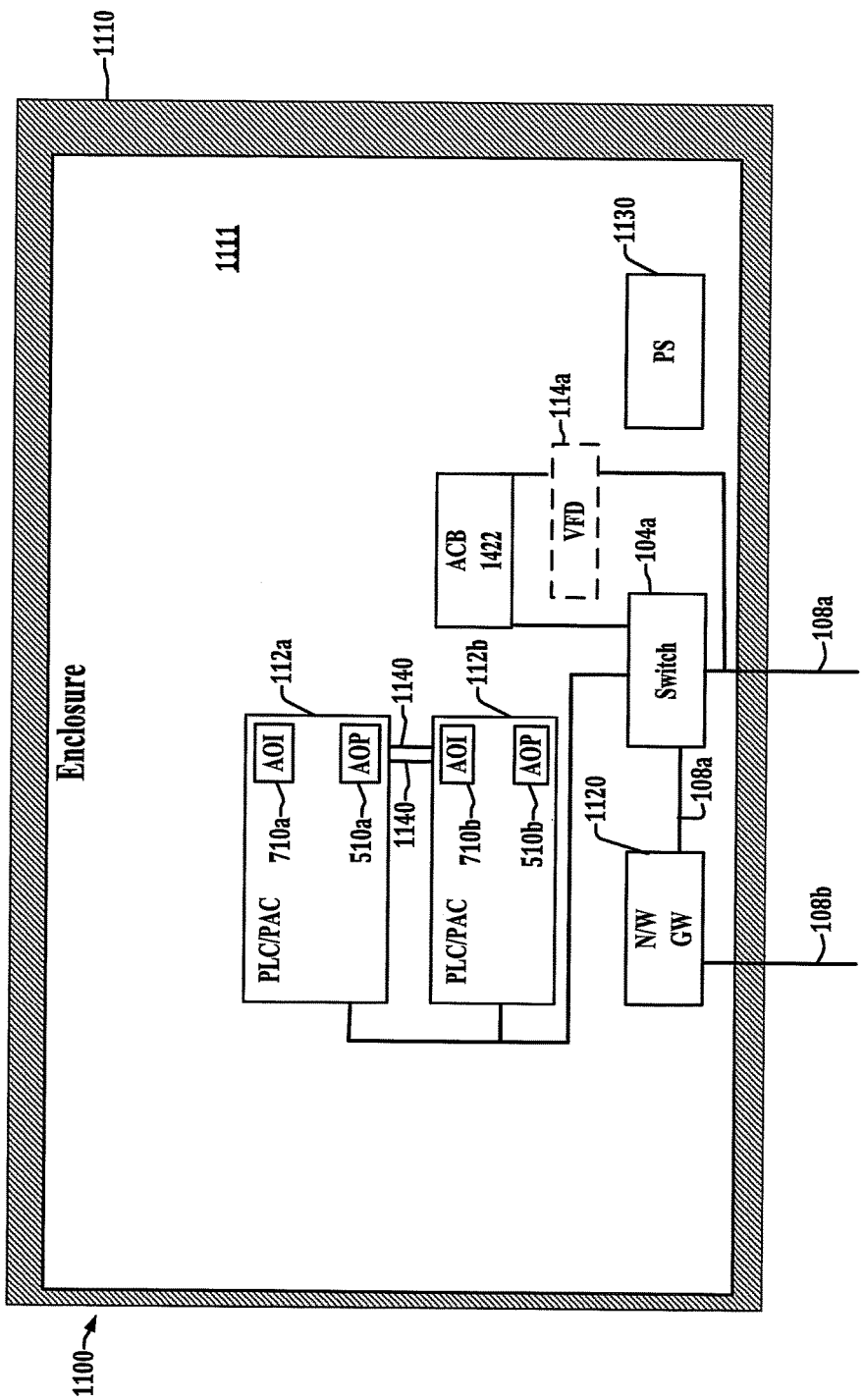
FIG. 14 shows another embodiment of an interface apparatus with an enclosure, including a pair of redundant process controllers, a network gateway, a network switch, and an air circuit breaker or other intelligent electrical device.

FIG. 14 shows another embodiment of an apparatus 1100 with an enclosure 1110, including a pair of redundant process controllers 112, a network gateway 1120, a network switch 104a, and an air circuit breaker 1422 or other IED.

Figure 15:
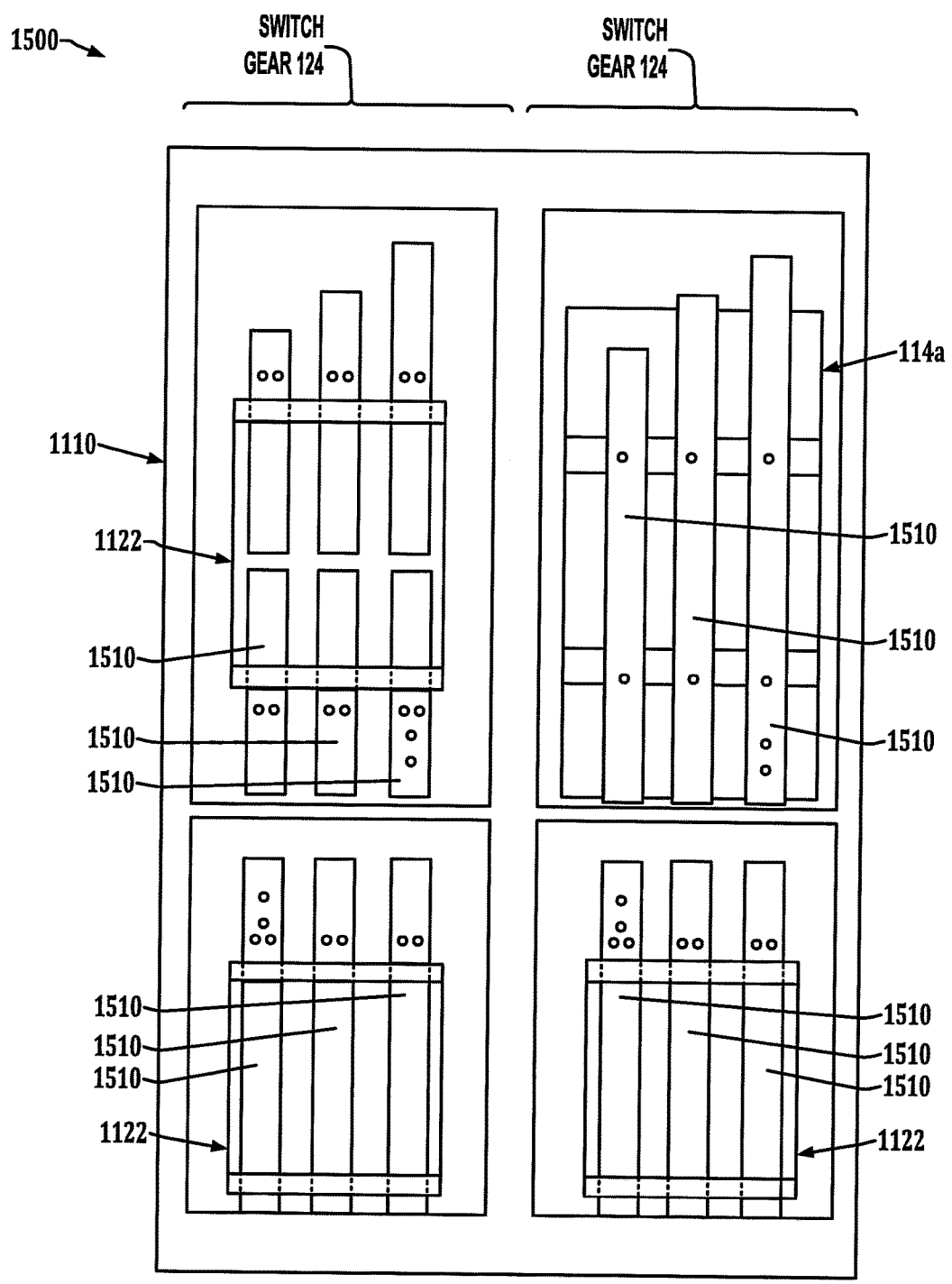
FIG. 15 shows a rear view of an embodiment of an apparatus including electrical interconnections between an intelligent air circuit breaker and a process automation device in a single enclosure.

FIG. 15 shows a rear view of an embodiment of an apparatus 1500. The busbars 1510 may provide power to one or more automation devices with the power distribution controlled (e.g., switched) by the circuit breaker 1422 (not shown). The three-phase Busbars 1510 (shown vertically) may be used to provide power (e.g., from a supply) to individual ACBs 1422, and each of the ACBs connects or disconnects the supply power to its own load (e.g., the load could be a motor drive or other automation device). Use of the busbars 1510 eliminates the need for external cabling interconnections to distribute power.

Also, it should be noted that all of the components or any combination thereof can be packaged as a bucket. Then, multiple buckets may be included in a single apparatus 1100. This provides an elegant modular solution allowing for an easy configuration. For example, there may be an apparatus 1100 with two buckets, each having an associated circuit breaker, or three buckets, each having an associated circuit breaker, and so forth.

In addition, although not shown in FIG. 14, the interior 1111 may include a motor control center (MCC). The MCC may include any combination of a motor drive (e.g. VFD 114a), electronic overload relays, a soft starter, and a power line monitor.

In the embodiment shown in FIG. 15, there are multiple enclosures 1110. Also shown is ACBs 1122. The VFD 114a receives power from one of the ACBs 1122.

EMAX2 Integration—the apparatus 1100 provides alternatives to EDS file, 16 bit padding to avoid unsigned data issues for interfacing vial EtherNet/IP with Logix Controllers, as well as IEC 61850 Functionality and Reporting. The apparatus 1100 provides ACB EMAX2 IA Integration and integration with SEL IA via native EtherNet/IP or using a network gateway, such as ProSoft Gateway to translate IEC 61850 MMS and GOOSE to EtherNet/IP IEC61850 Network Integration via CISCO equipment, and IEC 61850 Compliance with Stratix Switches: 8300/8000 meet the environmental specifications, 5700 in testing and validation of environmental specs, Time domain IEEE 1588 differences, Quality of Service (QoS) is not designed for all mechanisms of IEC 61850, IE 2000-U, Switch Database Management; built for substation automation, and IEC 61850 support for devices including Goose. Cisco IE 4000U/5000U: Equates to Stratix 5400/5410, supports hybrid configurations for both automation and electrical distribution.

The apparatus 1100 provides Facility Management, including Energy consumption/flow, Device/IED predictive diagnostics, PQ measures, Event Level Diagnostics, Process Availability (Uptime), Demand Management Control and LV/MV Distribution System. The apparatus 1100 provides Operations Management: Operations Efficiency, Economic Energy Optimization, Predictive Analytics (Cloud), Control System Availability, and Process Optimization.

As discussed above, the CLX is able to provide command and control to the air circuit breaker. This complete closed coupled solution provides an Intelligent Packaged Power Lineup (IPPL) 1100 based on additive properties of technology in that 'Smart Device A'+'Smart Device B'=New technological innovation providing added customer value. Disclosed examples are shown in FIGS. 14-17, wherein the apparatus provides an Intelligent Packaged Power Lineup (IPPL) 1100 comprised of one or more 'Intelligent Air Circuit Breaker' switch gear devices in combination with one or more 'Intelligent Motor Control Centers'. In one example, the MCC and circuit breaker are housed in IEC enclosures as shown, such as an Allen-Bradley IEC CENTERLINE 2500 MCC with IntelliCENTER. The intelligent package includes embedded communication protocols within the product that allow for both SCADA and command and control functionality of the device itself. In one example, the circuit breaker is a low voltage circuit breaker, for example, one or more ACBs rated for 600 V operation or less. Previous low voltage air circuit breakers were either controlled by a hardwired relay or manual setting of the circuit breaker itself and commissioning.

The Intelligent MCCs can be provisioned for operation in association with multiple types of network technologies and protocols, including without limitation DeviceNet based MCCs, unmodified Ethernet, Ethernet/IP, IFC 61850, DNP3.0, etc. DeviceNet has largely been replaced with EtherNet/IP as a preferred communication methodology, and devices have been developed to communicate over unmodified Ethernet. These devices include drives, relays, PLCs, as well as others. Rockwell has developed the Intellicenter networked Intelligent MCC. The apparatus 1100 advantageously allows single source supply of both infrastructure and automation equipment to provide a 'more complete solution' to the end customer, particularly with respect to supply of switchgear and MCCs. Moreover, the apparatus 1100 facilitates the ability to interface the switch gear with a distributed control system (DCS) or other controller, allowing an electrical automation system to provide command and control, as well as SCADA energy data.

In one example, the apparatus 1100 is configured as a Main-Tie-Main system that demonstrates the technology and network linkage between the CLX controller and various Air Circuit Breakers (ACBs). In other non-limiting examples, a Main configuration is provided. In another example, a Main-Main configuration is provided.

Figure 16:
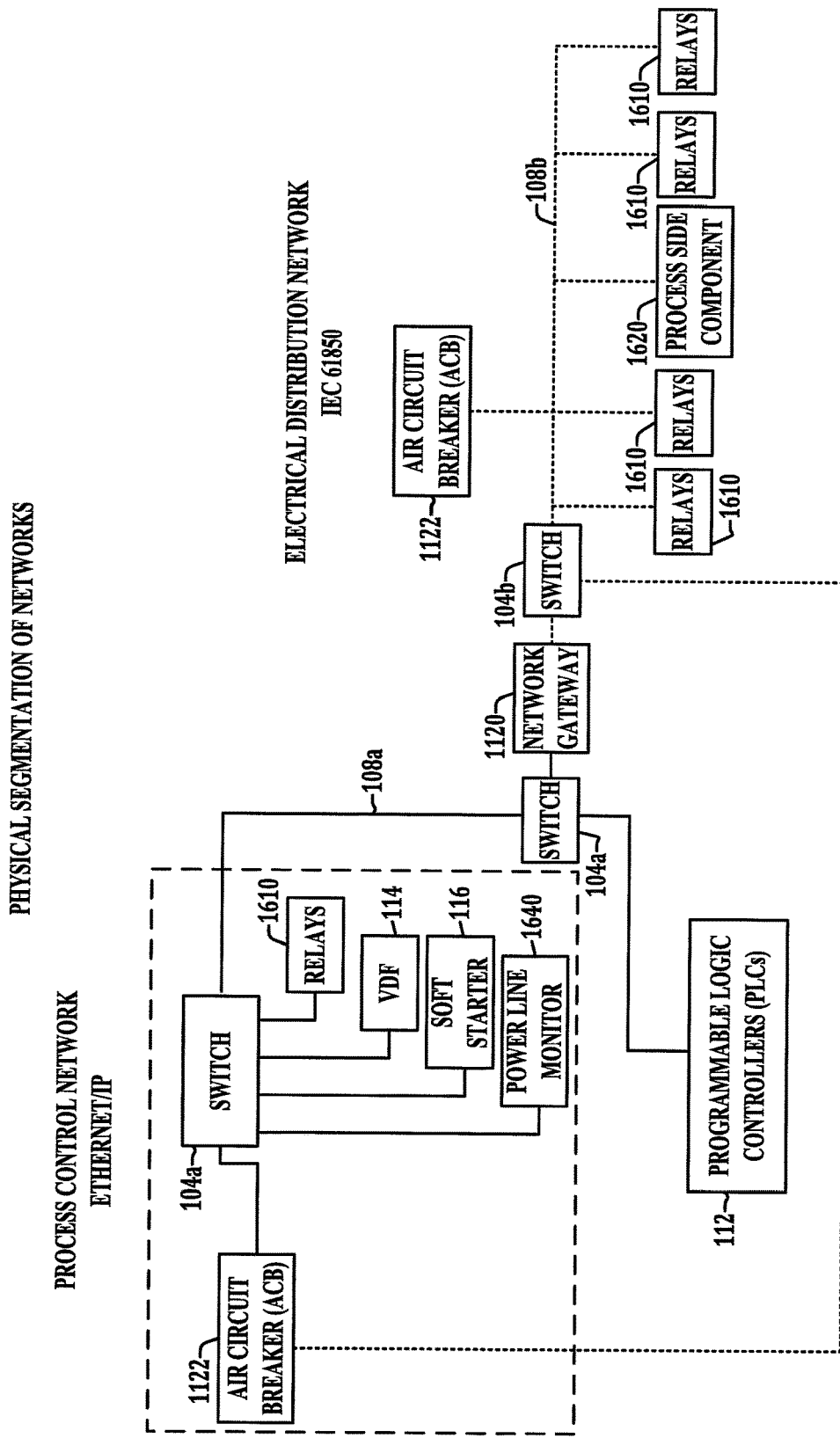
FIG. 16 shows an embodiment where a logix is a master.
Figure 17:
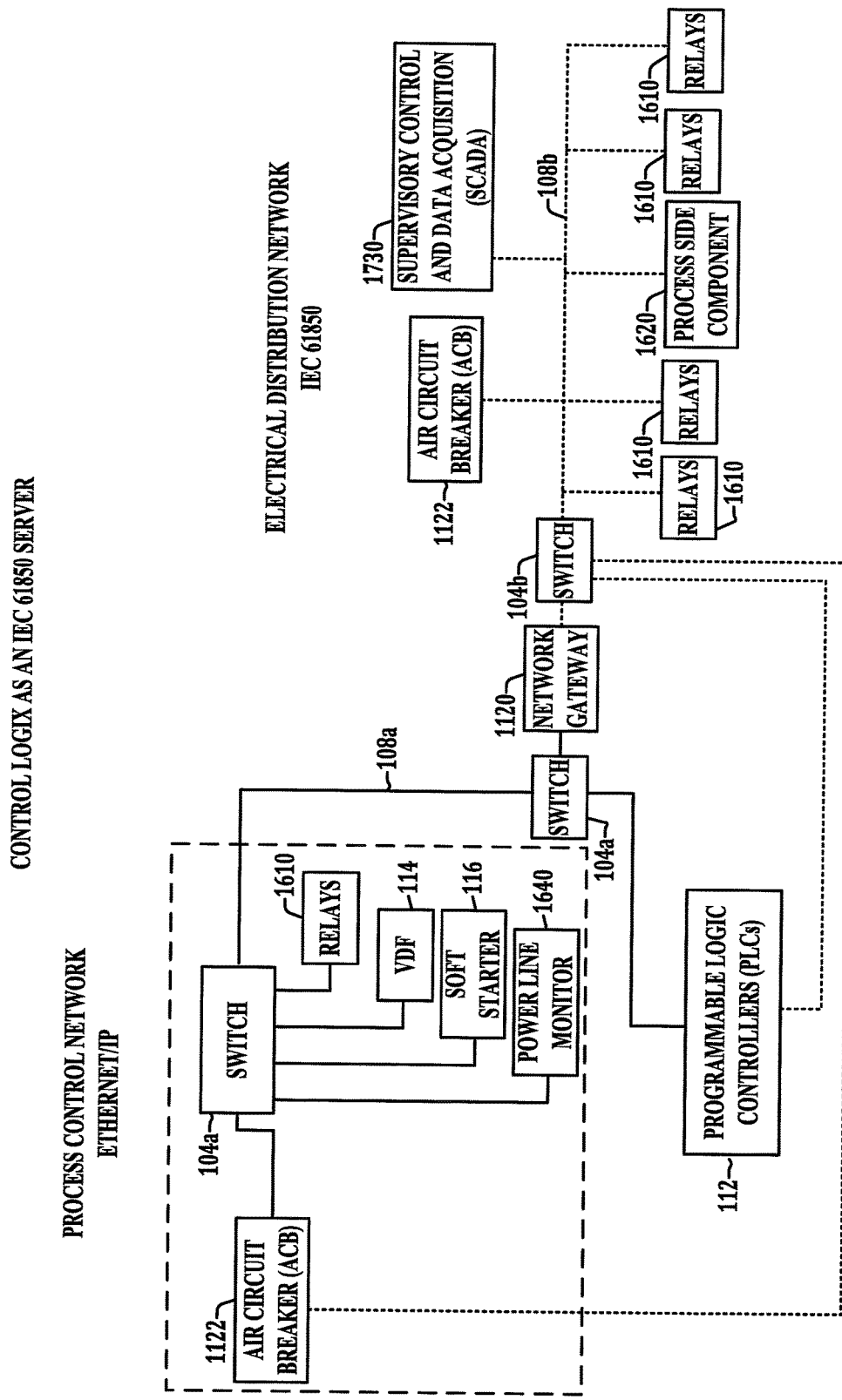
FIG. 17 shows an embodiment where a logix is a slave.

FIG. 16 shows an embodiment where a logix is a master. FIG. 17 shows an embodiment where a logix is a slave. For example, FIG. 17 shows SCADA 1730 controlling logix 112. Also shown are: relays 1610, process side component 1620, a motor drive (e.g. VFD 114a), a soft starter 116, and a power line monitor 1640. In FIGS. 16 and 17, the first network 108a is shown with a solid line, and the second network 108b is shown with a dashed line.

By providing a complete intelligent packaged power lineup solution that is closed coupled, turnkey project solutions are facilitated for the process space as well as within the electrical automation space. In one example, the MCC includes a programmable logic controller (PLC) or a programmable automation controller (PAC) which uses the networked connection of the MCC with the ACB to read and control the circuit breaker within the switchgear/MCC apparatus 1100 for both process and power control. The MCC and the switchgear units in some examples are referred to as IEC buckets, and can have power connections via busbars 1510, thus eliminating the need for external cabling interconnections to distribute power.

EMAX2 Integration—the apparatus 1100 provides alternatives to EDS file, 16 bit padding to avoid unsigned data issues for interfacing vial EtherNet/IP with Logix Controllers, as well as IEC 61850 Functionality and Reporting. The apparatus 1100 provides ACB EMAX2 IA Integration and integration with SEL IA via native EtherNet/IP or using a network gateway, such as ProSoft Gateway to translate IEC 61850 MMS and GOOSE to EtherNet/IP IEC61850 Network Integration via CISCO equipment, and IEC 61850 Compliance with Stratix Switches: 8300/8000 meet the environmental specifications, 5700 in testing and validation of environmental specs, Time domain IEEE 1588 differences, Quality of Service (QoS) is not designed for all mechanisms of IEC 61850, IE 2000-U, Switch Database Management; built for substation automation, and IEC 61850 support for devices including Goose. Cisco IE 4000U/5000U: Equates to Stratix 5400/5410, supports hybrid configurations for both automation and electrical distribution.

The apparatus 1100 provides Facility Management, including Energy consumption/flow, Device/LED predictive diagnostics, PQ measures, Event Level Diagnostics, Process Availability (Uptime), Demand Management Control and LV/MV Distribution System. The apparatus 1100 provides Operations Management: Operations Efficiency, Economic Energy Optimization, Predictive Analytics (Cloud), Control System Availability, and Process Optimization. Thus, the apparatus provides a simple solution to the problem of interfacing a process automation space and an electrical automation space. For example, the above-described AOP 510 and AOI 710 allow for an improved interface. In another example, providing the above described components in a single enclosure 1110 simplifies creating an interface between a process automation space and an electrical automation space. In addition, as described above, for example, with respect to FIG. 15, even greater simplification and control is provided with the described modular solution.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims. In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter. In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A computer or machine-readable medium includes any mechanism for storing or transmitting information in a non-transitory form readable by a machine (e.g., a computer). For instance, a machine-readable medium includes read only memory ("ROM"); random access memory ("RAM"); magnetic disk storage media; optical storage media; and flash memory devices, just to mention a few examples. The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims. In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An apparatus to interface a process automation system including one or more process automation system devices connected to a first network with an electrical automation system including an intelligent electrical device (IED) connected to a second network, the apparatus comprising:
   an enclosure with an interior;
   a network switch disposed in the interior of the enclosure and operatively coupled with the first network;
   a process controller disposed in the interior of the enclosure and operatively coupled with the network switch; and
   a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch;
   the process controller being configured to:
      execute an add-on instruction (AOI) to selectively convert unsigned IED data into signed IED data, and
      scale raw IED data from the TED according to user-defined scale factors to provide scaled data values for use by the process controller in controlling at least one process.

2. The apparatus of claim 1, wherein the process controller is further configured to execute the AOI to scale the data from the IED in the form of unsigned integers to signed real values or floating point values.

3. The apparatus of claim 1, wherein the process controller is further configured to execute the AOI to interface a signed data type to an industrial controller tag within a computing system environment.

4. The apparatus of claim 1, further comprising a redundant process controller.

5. The apparatus of claim 1, wherein the enclosure is a NEMA enclosure.

6. The apparatus of claim 1, wherein the enclosure is an IEC enclosure.

7. The apparatus of claim 1, wherein the process controller is further configured to:
send an add-on profile (AOP) program to a processor to define data to be exchanged between the IED of the electrical automation system and the process controller in a communication stream over a networked communications protocol according to information from an electronic data sheet (EDS) file corresponding to the IED.

8. The apparatus of claim 1, wherein the IED is disposed in the interior of the enclosure.

9. The apparatus of claim 8, wherein the IED comprises an air circuit breaker.

10. The apparatus of claim 1, further comprising a motor drive disposed in the interior of the enclosure and operatively coupled to the first network.

11. The apparatus of claim 1, wherein the IED is configured to provide power to a soft starter.

12. The apparatus of claim 1, wherein the process controller is further configured to execute the AOI to scale the data from the IED in the form of unsigned integers to signed floating point values.

13. An apparatus to interface a process automation system including one or more process automation system devices connected to a first network with an electrical automation system including an intelligent electrical device (IED) connected to a second network, the apparatus comprising:
an enclosure with an interior;
a network switch disposed in the interior of the enclosure and operatively coupled with the first network;
a process controller disposed in the interior of the enclosure and operatively coupled with the network switch; and
a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch;
the process controller being configured to:
send an add-on profile (AOP) program to a processor to define data to be exchanged between the IED of the electrical automation system and the process controller in a communication stream over a networked communications protocol according to information from an electronic data sheet (EDS) file corresponding to the IED; and
send the add-on profile (AOP) program to the processor to provide a graphical user interface (GUI) for at least one of: configuring a requested packet interval (RPI) for class 1 connections, and filtering of real time data tags from the IED.

14. The apparatus of claim 13, wherein the networked communications protocol includes at least one of IEC 61850 MMS, GOOSE, SV, DNP 3.0, IEC 60870-5, Modbus TCP, Ethernet IP and DeviceNet.

15. The apparatus of claim 13, wherein the process controller is further configured to send the add-on profile (AOP) program to the processor to provide a graphical user interface (GUI) for all of: assignment of an IP address for the IED, configuring a requested packet interval (RPI) for class 1 connections, and filtering of real time data tags from the IED.

16. The apparatus of claim 13, further comprising a redundant process controller.

17. The apparatus of claim 13, wherein the enclosure is a NEMA enclosure.

18. The apparatus of claim 13, wherein the enclosure is an IEC enclosure.

19. The apparatus of claim 13, wherein the IED is disposed in the interior of the enclosure.

20. A system to interface a process automation system including one or more process automation system devices connected to a first network with an electrical automation system including an intelligent electrical device (IED) connected to a second network, comprising:
an enclosure with an interior;
a network switch disposed in the interior of the enclosure and operatively coupled with the first network;
a process controller disposed in the interior of the enclosure and operatively coupled with the network switch;
a soft starter configured to receive power from the IED; and
a network gateway module disposed in the interior of the enclosure and operatively coupled with the second network and with the network switch, the network gateway module operative to translate IED data sent on the second network by the IED for the process controller into a message format (Ethernet/IP) of the first network and to provide the translated first data to the network switch;
a high accuracy timing device in communication with the switch, the high accuracy timing device configured for:
distributing a time signal through the first network operatively coupled with the process controller of the process automation system; and
distributing the time signal through the second network operatively coupled with the IED of the electrical automation system;
wherein the process controller is in communication with the switch, and the process controller is configured to:
execute an add-on instruction (AOI) of the process automation system to selectively convert unsigned data from IED into signed data and to scale raw data from the IED according to user-defined scale factors to provide scaled data values for use by the process controller in controlling at least one process.

21. The system of claim 20, wherein the process controller is in communication with the switch, and the process controller is configured to:
send an add-on profile (AOP) program to a processor to define data to be exchanged between the IED of the electrical automation system and the process controller in a communication stream over a networked communications protocol according to information from an electronic data sheet (EDS) file corresponding to the IED.

* * * * *